US012713638B2

(12) United States Patent
Chang et al.

(10) Patent No.: US 12,713,638 B2
(45) Date of Patent: Aug. 18, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Huang-Chao Chang, Hsinchu City (TW); Ta-Chun Lin, Hsinchu (TW); Chun-Sheng Liang, Changhua County (TW); Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 497 days.

(21) Appl. No.: 18/332,507

(22) Filed: Jun. 9, 2023

(65) Prior Publication Data

US 2024/0413231 A1 Dec. 12, 2024

(51) Int. Cl.

| | |
|---|---|
| ***H10D 30/43*** | (2025.01) |
| ***H10D 30/01*** | (2025.01) |
| ***H10D 30/67*** | (2025.01) |
| ***H10D 62/10*** | (2025.01) |
| ***H10D 64/01*** | (2025.01) |
| ***H10D 84/83*** | (2025.01) |

(52) U.S. Cl.

CPC ........... *H10D 30/43* (2025.01); *H10D 30/014* (2025.01); *H10D 30/6735* (2025.01); *H10D 62/121* (2025.01); *H10D 64/017* (2025.01); *H10D 64/018* (2025.01); *H10D 84/83* (2025.01)

(58) Field of Classification Search

CPC .. H10D 30/43; H10D 30/014; H10D 30/6735; H10D 62/121; H10D 64/017; H10D 64/018; H10D 84/83; H10D 30/6757; H10D 64/015; H10D 64/021; H10D 64/518

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |

(Continued)

*Primary Examiner* — Mohammad A Rahman

(74) *Attorney, Agent, or Firm* — Birch, Stewart, Kolasch & Birch, LLP

(57) ABSTRACT

A semiconductor structure includes a substrate, a vertical stack including nanostructures, and a gate structure wrapping around each of the nanostructures. The nanostructures are suspended and vertically arranged over the substrate. The gate structure includes a gate dielectric layer and a gate electrode formed on the gate dielectric layer. The semiconductor structure further includes inner spacers and gate spacers. The inner spacers are formed on opposite sides of the gate structure, between the nanostructures, and separating the nanostructures from each other. The gate spacers are formed on the opposite sides of the gate structure and over a topmost one of the nanostructures. The gate dielectric layer includes a first portion formed on the nanostructures and a second portion extending from the first portion. The first portion and the second portion have a first thickness and a second thickness, respectively. The first thickness is greater than the second thickness.

20 Claims, 22 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2021/0408234 A1* | 12/2021 | Huang | H10D 84/834 |

* cited by examiner

B'
100
112B
108
106
108
106
108
106
202
102
102B
112A
102A
B
Z
Y
X
A'
100
108
106
108
106
108
106
102
112A
102A
A
Z
X
Y

A
A'
100
1002
402
904
806
804
902
1102
108
702
802
102
D2
1302
Z
X
Y
B
B'
108
1302
1102
102A
102B
202
102

1410
1530
1532
1534
1536
402
1536
T3
1102
1532
702
T2
1534
108
1402
1402
T1
1532
1102
108
1534
1532
1102

1520
1522
1526
402
1526
T3
108
1102
1522
702
108
1402
1402
1522
1102
1522
1102

1510
1512
1514
402
108
1102
1512
702
1514
T2
108
1402
1402
T1
1512
1102
702
1514
1512
1102

SEMICONDUCTOR STRUCTURE AND METHOD FOR FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high performance and low leakage applications. A GAA transistor has a gate structure that can extend, partially or fully, around a channel region to provide access to the channel region on two or more sides. While existing GAA transistors may be generally adequate for their intended purposes, they are not entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
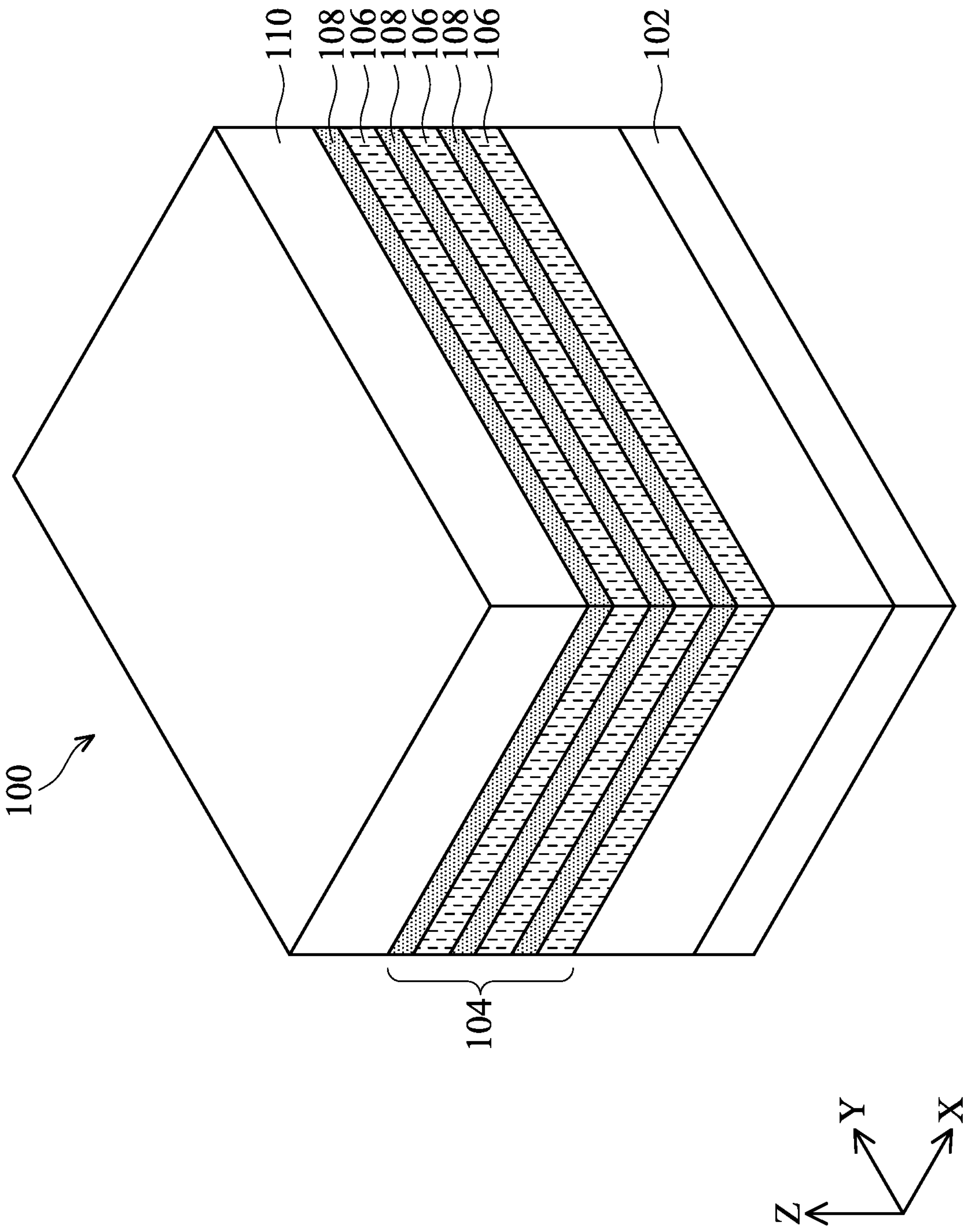
FIG. 1 and FIG. 2 are perspective views of a workpiece at various fabrication stages, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures with field-effect transistors (FETs), such as three-dimensional gate-all-around (GAA) transistors, in memory (e.g., SRAM) and/or standard logic cells of an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor.

The critical poly pitch (CPP), which means a pitch between a gate and an adjacent gate, of the GAA transistor is scaled down as the entire dimension of the GAA transistor continue to scale down. This will cause the decrease of gate length and thus results in deteriorated short-channel effect (SCE) and parasitic capacitance. Furthermore, the scaled down CPP has to be distributed to channel region and source/drain (S/D) region. If too much distance of CPP is distributed to channel region for increasing gate length, the dimension of source/drain region will be decreased and thus it will become difficult to perform epitaxy processes in source/drain region. If too much distance of CPP is distributed to source/drain region for reducing the difficulty of performing epitaxy processes in source/drain region, the gate length will become too short and thus deteriorate the SCE and parasitic capacitance.

The present disclosure provides embodiments of methods and structures with spacers having slimmed high-k gate dielectric layer. The high-k gate dielectric layer on spacers, such as inner spacers and/or gate spacers, may be slimmed to enlarge the space for the gate length or the inner spacers. More specifically, the gate length may be increased by forming the slimmed high-k gate dielectric layer, and therefore the SCE can be suppressed due to the increased gate length. Meanwhile, the space may also be utilized to increase the width of inner spacers, and the parasitic capacitance can therefore be suppressed.

For example, when the device dimension is scaled down, the gate length can be maintained due to the space being enlarged by slimming the high-k gate dielectric layer. On the other hand, in cases where the dimensions of the device stay the same, by slimming the high-k gate dielectric layer to enlarge space, the enlarged space can be distributed to the source/drain region to reduce the difficulty of epitaxy processes, while the gate length stays same.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise excepted or described.

Figure 2:
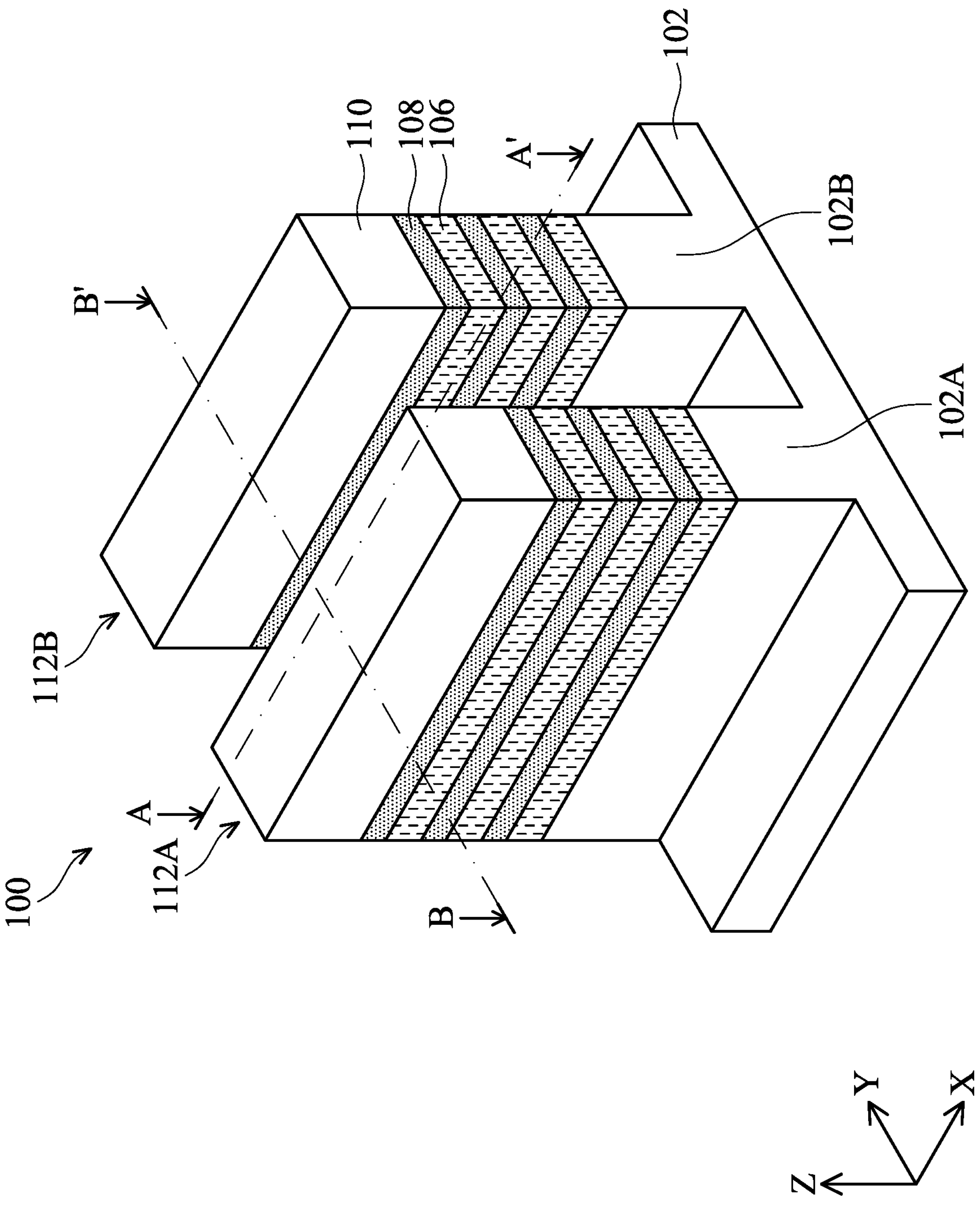

FIG. 1 and FIG. 2 are perspective views of a workpiece 100 at various fabrication stages, in accordance with some embodiments of the present disclosure. Referring to FIG. 1, a workpiece 100 is provided in accordance with some embodiments. As shown in FIG. 1, the workpiece 100 includes a substrate 102 and a stack 104 over the substrate 102, in accordance with some embodiments. In some embodiments, the substrate 102 contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure.

In some embodiments, the substrate 102 may include one or more well regions for forming different types of devices. For example, the well regions may be n-type well regions doped with an n-type dopant (e.g., phosphorus (P) or arsenic (As)) or p-type well regions doped with a p-type dopant (e.g., boron (B)). The n-type well regions and the p-type well regions may be formed by using ion implantation or thermal diffusion. In some embodiments, n-type wells have an n-type dopant concentration of about $5\times10^{16}$ $cm^{-3}$ to about $5\times10^{19}$ $cm^{-3}$, and p-type wells have a p-type dopant concentration of about $5\times10^{16}$ $cm^{-3}$ to about $5\times10^{19}$ $cm^{-3}$. Since the workpiece 100 will be fabricated into a semiconductor structure 100 upon conclusion of the fabrication processes, the workpiece 100 may be referred to as the semiconductor structure 100 as the context requires.

The stack 104 includes semiconductor layers 106 and semiconductor layers 108. The semiconductor layers 106 and 108 are alternatingly stacked in the Z-direction. The semiconductor layers 106 and the semiconductor layers 108 may have different semiconductor compositions. In some embodiments, semiconductor layers 106 are formed of silicon germanium (SiGe) and the semiconductor layers 108 are formed of silicon (Si). In these embodiments, the additional germanium content in the semiconductor layers 106 allow selective removal or recess of the semiconductor layers 106 without substantial damages to the semiconductor layers 108, so that the semiconductor layers 106 are also referred to as sacrificial layers.

In some embodiments, the semiconductor layers 106 and 108 are epitaxially grown over (on) the substrate 102 using a deposition technique such as epitaxial growth, vapor-phase epitaxy (VPE), and molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 106 and the semiconductor layers 108 are deposited alternatingly, one-after-another, to form the stack 104. It should be noted that, three (3) layers of the semiconductor layers 106 and three (3) layers of the semiconductor layers 108 are alternately and vertically arranged (or stacked) as shown in FIG. 1, which are for illustrative purposes only and not intended to be limiting beyond what is specifically recited in the claims. The number of layers depends on the desired number of channels members for the semiconductor device. In some embodiments, there may be from 2 to 10 semiconductor layers 106 alternating with 2 to 10 semiconductor layers 108 in the stack 104.

For patterning purposes, the workpiece 100 may also include a hard mask layer 110 over the stack 104. The hard mask layer 110 may be a single layer structure or a multi-layer structure. In some embodiments, the hard mask layer 110 is a single layer structure and includes a silicon germanium layer. In some embodiments, the hard mask layer 110 is a multi-layer structure and includes a silicon nitride layer and a silicon oxide layer over the silicon nitride layer. In some other embodiments, the hard mask layer 110 is a multi-layer structure and includes a silicon germanium layer and a silicon layer over the silicon germanium layer.

Referring to FIG. 2, the substrate 102, the stack 104, and the hard mask layer 110 are then patterned to form fin structure 112A and fin structure 112B (may be collectively referred to as fin structures 112) over the substrate 102, in accordance with some embodiments. In some embodiments, each of the fin structures 112 includes a base portion (base fins 102A and 102B) formed from a portion of the substrate 102 and a stack portion formed from the stack 104 over the base portion, as shown in FIG. 2. The stack portion includes the semiconductor layers 106 and the semiconductor layers 108 alternately stacked over the substrate 102. In some embodiments, the base fins 102A and 102B protrude from the substrate 102. Each of the fin structures 112 extends lengthwise in the X-direction and extends vertically in the Z-direction over the substrate 102, and arranged in the Y-direction. In some embodiments, widths of the fin structures 112 along the Y-direction are the same. Although the two fin structures 112A and 112B are formed and shown herein, more fin structures may be formed, such as three or more fins.

The fin structures 112 may be patterned using suitable processes including photolithography processes and etching processes. The suitable processes may include double-patterning or multi-patterning processes. For example, in some embodiments, a material layer is formed over a substrate and patterned using a photolithography process. Spacers are formed alongside the patterned material layer using a self-aligned process. The material layer is then removed, and the remaining spacers, or mandrels, may then be used to pattern the fin structures 112 by etching the stack 104 and the substrate 102. The etching process may include dry etching, wet etching, reactive ion etching (RIE), and/or other suitable processes. In some embodiments, the lithography processes include photoresist coating (e.g., spin-on coating), soft baking, mask aligning, exposure, post-exposure baking, developing the photoresist, rinsing, and drying (e.g., hard baking). In some other embodiments, the photolithography processes may be implemented or replaced by other suitable methods, such as maskless photolithography, electron-beam (e-beam) writing, and ion-beam writing.

FIGS. 3A to 14A are X-Z cross-sectional views of the workpiece 100 at various fabrication stages along a line A-A' of FIG. 2, in accordance with some embodiments of the present disclosure. FIGS. 3B to 14B are Y-Z cross-sectional views of the workpiece 100 at various fabrication stages along a line B-B' of FIG. 2, in accordance with some embodiments of the present disclosure.

Figure 3B:
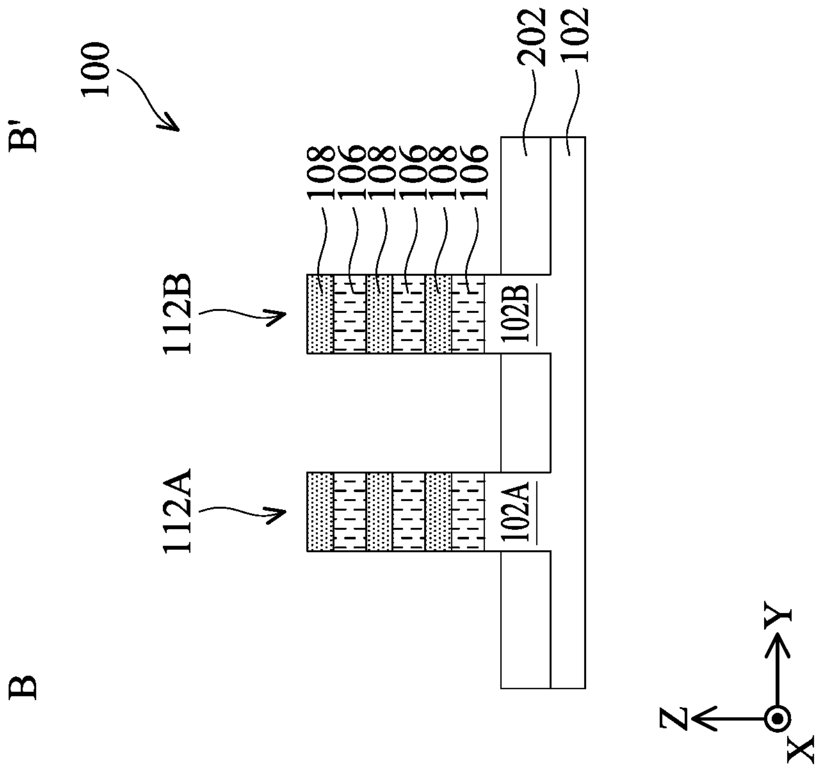
FIGS. 3B, 4B, 5B, 6B, 7B, 8B, 9B, 10B, 11B, 12B, 13B, and 14B are Y-Z cross-sectional views of the workpiece at various fabrication stages along a line B-B' of FIG. 2, in accordance with some embodiments of the present disclosure.
Figure 3A:
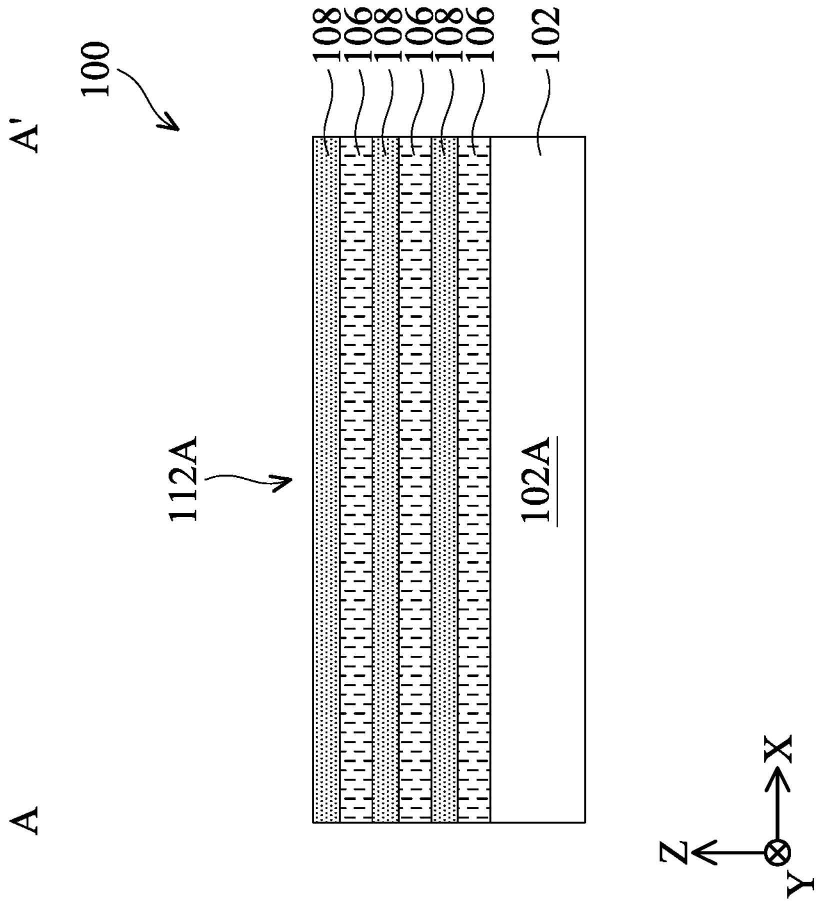
FIGS. 3A, 4A, 5A, 6A, 7A, 8A, 9A, 10A, 11A, 12A, 13A, and 14A are X-Z cross-sectional views of the workpiece at various fabrication stages along a line A-A' of FIG. 2, in accordance with some embodiments of the present disclosure.

Referring to FIGS. 3A and 3B, an isolation structure 202 is formed, in accordance with some embodiments. After the fin structures 112 are formed, the hard mask layer 110 over the fin structures 112 is removed and the isolation structure 202 is formed over the substrate 102. In some embodiments, the isolation structure 202 is formed between the fin structures 112. In some other aspects, the isolation structure 202 is formed around the fin structures 112. More specifically, the isolation structure 202 is formed between and around the base fins (e.g., base fins 102A and 102B) of the fin structures 112. The isolation structure 202 may also be referred to as shallow trench isolation (STI) feature.

In some embodiments, a dielectric material for the isolation structure 202 is first deposited over the workpiece 100. Specifically, the dielectric material is deposited and formed over the fin structures 112 and the substrate 102 to cover the fin structures 112 and the substrate 102. In some aspects, the dielectric material is formed to wrap around the fin structures 112. In some embodiments, the dielectric material may include silicon oxide, silicon nitride, silicon oxynitride, fluorine-doped silicate glass (FSG), a low-k dielectric material, combinations thereof, and/or other suitable materials. In various embodiments, the dielectric material may be deposited by a deposition process, such as a CVD, a subatmospheric CVD (SACVD), a flowable CVD (FCVD), an ALD, spin-on coating, and/or other suitable process. The deposited dielectric material is then thinned and planarized, for example by a chemical mechanical polishing (CMP) process, until top surfaces of the hard mask layer 110 is exposed (not shown). The planarized dielectric material is further recessed by a dry etching process, a wet etching process, and/or a combination thereof to form the isolation structure 202. In some embodiments, the stack portions of the fin structures 112 rise above the isolation structures 202 while the base fins 102A and 102B are surrounded by the isolation structures 202, as shown in FIG. 3B. In other words, top surfaces (or topmost surfaces) of the substrate 102 are higher than top surfaces of the isolation structure 202. In some embodiments, before the formation of the isolation structure 202, a liner layer may be conformally deposited over the substrate 102 using ALD or CVD.

Figure 4B:
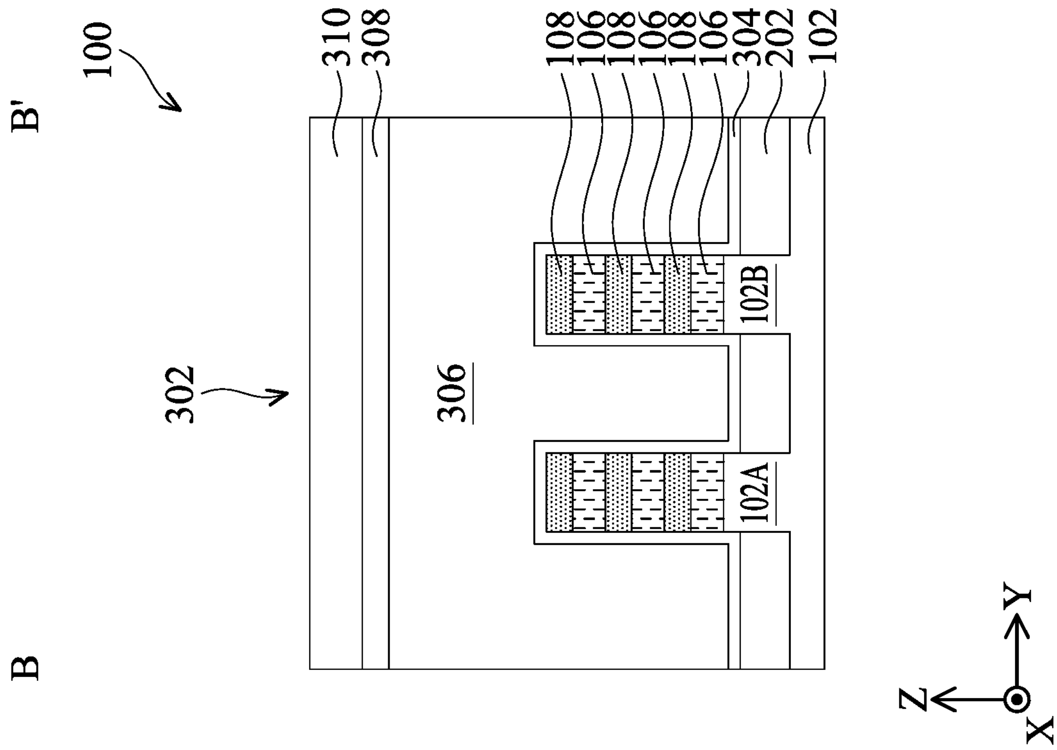
Figure 4A:
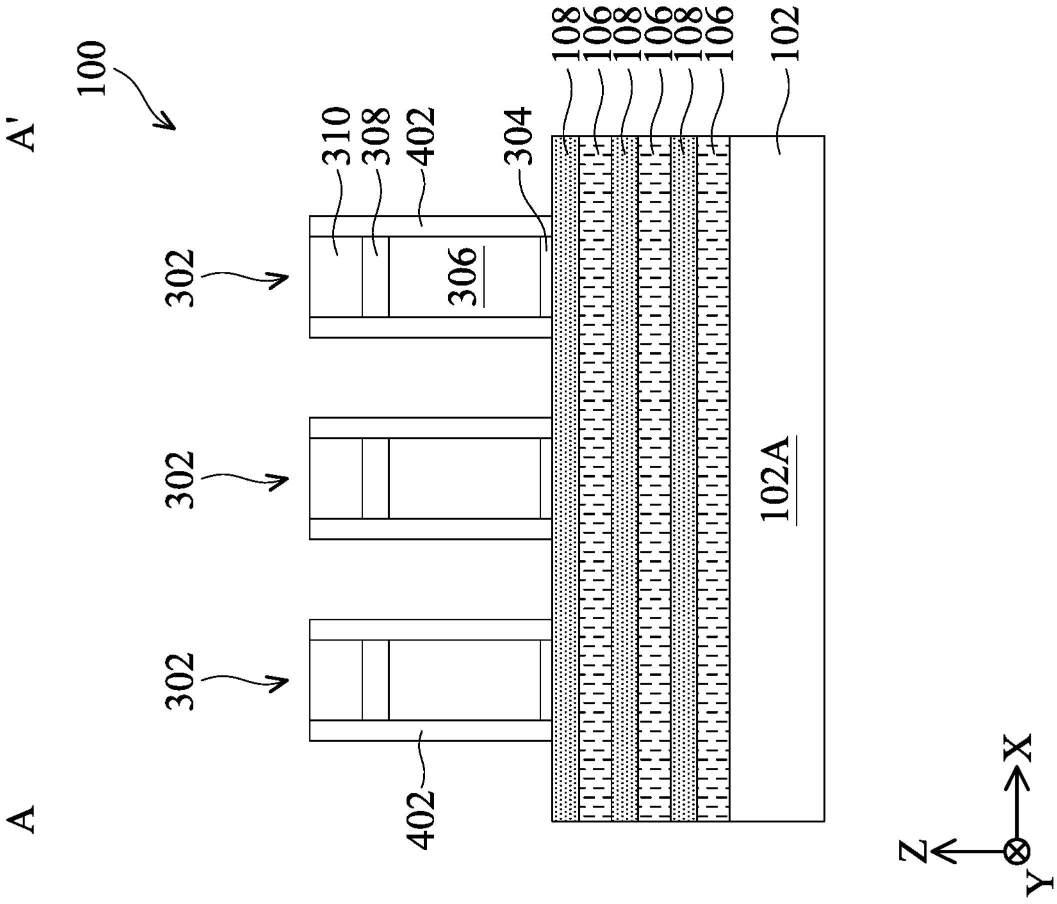

Referring to FIGS. 4A and 4B, dummy gate structures 302 may be formed over the fin structures 112 and over the isolation structure 202, in accordance with some embodiments. In some embodiments, the dummy gate structures 302 may be configured to extend lengthwise in the Y-direction and wrap around top surfaces and side surfaces of the fin structures 112, as shown in FIG. 4B. In some embodiments, to form the dummy gate structures 302, a dummy gate dielectric material for dummy gate dielectric layers 304 is first formed over fin structures 112 and over the isolation structure 202. More specifically, in some embodiments, the dummy gate dielectric material is conformally formed on the sidewalls of the fin structures 112 and over the top surfaces of the fin structures 112 and the isolation structure 202, as shown in FIG. 4B. In some embodiments, the dummy gate dielectric layer 304 may include, for example, a dielectric material such as a nitride (e.g., silicon nitride, silicon oxynitride), a carbide (e.g., silicon carbide), an oxide (e.g., silicon oxide), or some other suitable material.

Then, in some embodiments, a dummy gate electrode material for dummy gate electrode layers 306 is formed over the dummy gate dielectric material. The dummy gate electrode material may include a conductive material selected from a group composed of polysilicon, W, Al, Cu, AlCu, Ti, TiAlN, TaC, TaCN, TaSiN, Mn, Zr, TiN, Ta, TaN, Co, Ni, and/or combinations thereof. The dummy gate electrode material and/or the dummy gate dielectric material may be formed by way of a thermal oxidation process and/or a deposition process (e.g., physical vapor deposition (PVD), CVD, plasma-enhanced CVD (PECVD), and ALD).

Then, hard mask layers 308 and 310 are formed over the dummy gate electrode material. In some embodiments, the hard mask layers 308 and 310 may be formed using photolithography and removal (e.g., etching) processes. In some embodiments, the hard mask layers 308 and 310 may include photoresist materials or hard mask materials. In some embodiments, the hard mask layer 308 may be a silicon nitride layer and the hard mask layer 310 may be a silicon oxide layer. After the formation of the hard mask layers 308 and 310, a removal process (e.g., etching) may be performed to remove portions of the dummy gate electrode material for the dummy gate electrode layers 306 and the dummy gate dielectric material for the dummy gate dielectric layers 304 that are not directly underlie the hard mask layers 308 and 310, thereby forming the dummy gate structures 302. Each of the dummy gate structures has the dummy gate dielectric layers 304, the dummy gate electrode layers 306, and the hard mask layers 308 and 310. The dummy gate dielectric layers 304 may also be referred to as dummy interfacial layers.

The dummy gate structures 302 may undergo a gate replacement process through subsequent processing to form metal gates, such as a high-k metal gate, as discussed in greater detail below. FIG. 4A shows three dummy gate structures 302. In some embodiments, less or more dummy gate structures may be formed for one or more transistors sharing source/drain regions.

Still referring to FIGS. 4A and 4B, after the formation of the dummy gate structures 302, gate spacers 402 are formed on sidewalls of the dummy gate structures 302 and over the top surfaces of the fin structures 112, in accordance with some embodiments. More specifically, in some embodiments, the gate spacers 402 are formed on opposite the sidewalls of the dummy gate structures 302, as shown in FIG. 4A. The gate spacers 402 may include silicon nitride ($Si_3N_4$), silicon oxide ($SiO_2$), silicon carbide (SiC), silicon oxycarbide (SiOC), silicon oxynitride (SiON), silicon carbon nitride (SiCN), silicon oxycarbon nitride (SiOCN), carbon doped oxide, nitrogen doped oxide, porous oxide, or combinations thereof. In some embodiments, the gate spacers 402 include a low-k dielectric material, such as those described herein. The gate spacers 402 may include a single layer or a multi-layer structure.

In some embodiments, the gate spacers 402 may be formed by conformally depositing a spacer layer (containing the dielectric material) over the fin structures 112 and the dummy gate structures 302. Then, an anisotropic etching process is performed to remove top portions of the spacer layer from the top surfaces of the fin structures 112 and the dummy gate structures 302. After the anisotropic etching process, portions of the spacer layer on the sidewall surfaces of the fin structures 112 and the dummy gate structures 302 substantially remain and become the gate spacers 402. In some embodiments, the anisotropic etching process is a dry (e.g., plasma) etching process. Additionally or alternatively, the formation of the gate spacers 402 may also involve chemical oxidation, thermal oxidation, ALD, CVD, and/or other suitable methods. The gate spacers 402 may also be interchangeably referred to as top spacers.

Figure 5B:
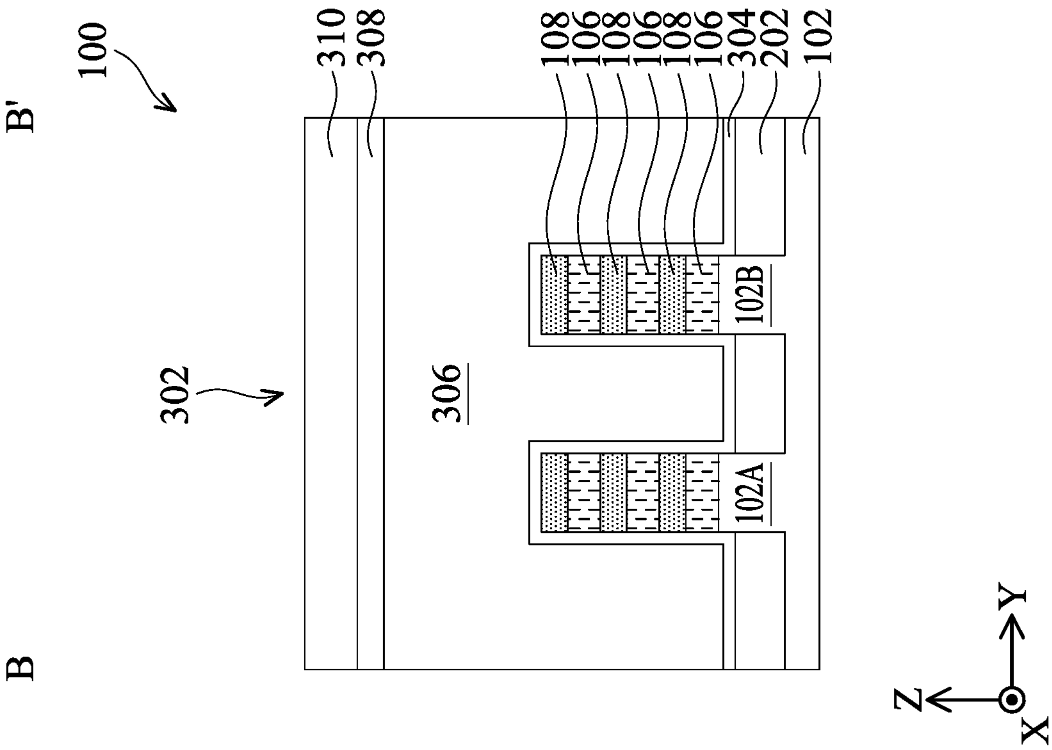
Figure 5A:
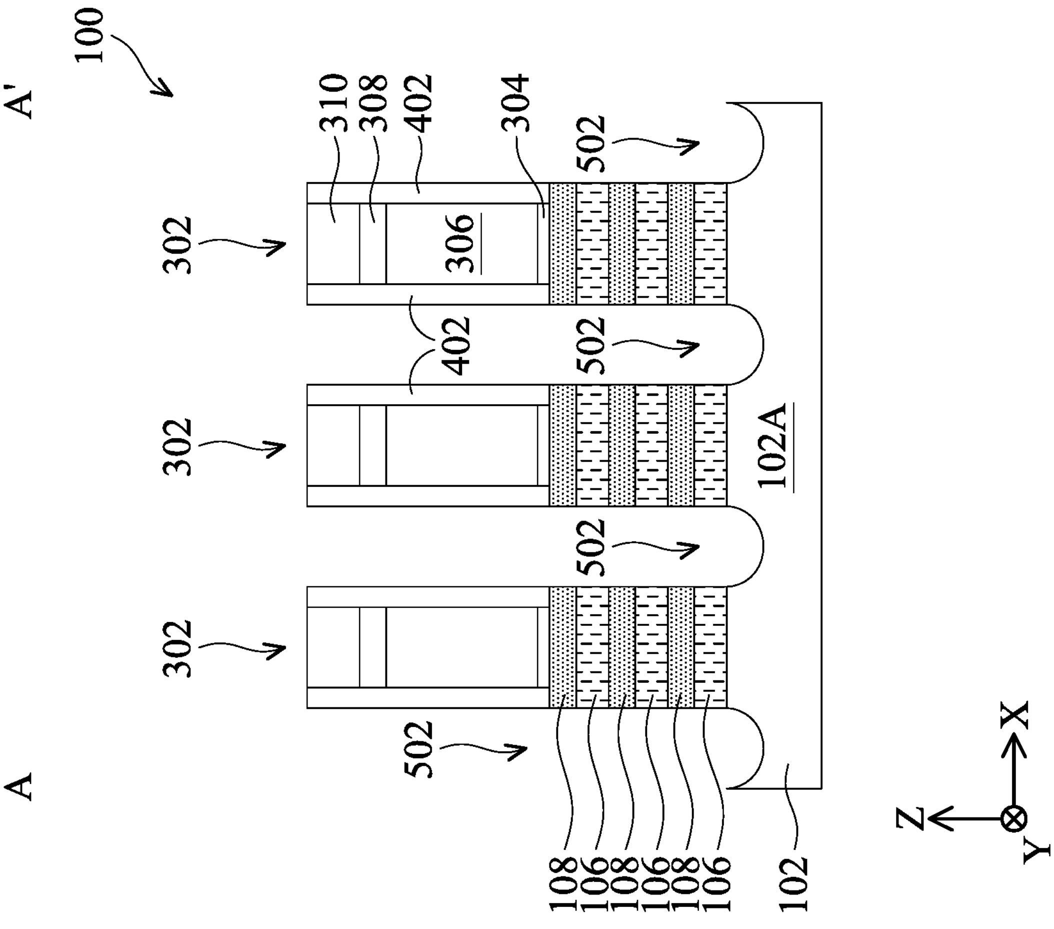

Referring to FIGS. 5A and 5B, the fin structures 112 are recessed to form source/drain trenches 502 in the fin structures 112 (or passing through semiconductor layers 106 and 108) for source/drain regions, in accordance with some embodiments. The source/drain trenches 502 are formed on opposite sides of the dummy gate structures 302. Specifically, the source/drain trenches 502 may be formed by performing one or more etching processes to remove portions of the semiconductor layers 106, the semiconductor layers 108, and the substrate 102 (e.g., base fins 102A and 102B) that do not vertically overlap or not be covered by the dummy gate structures 302 and the gate spacers 402. In some embodiments, a single etchant may be used to remove the semiconductor layers 106, the semiconductor layers 108, and the substrate 102. In other embodiments, multiple etchants may be used to perform the etching process. In some embodiments, portions of the substrate 102 are etched, so that the source/drain trenches 502 each has a concave surface in the substrate 102, as shown in FIG. 5A.

Figure 6A:
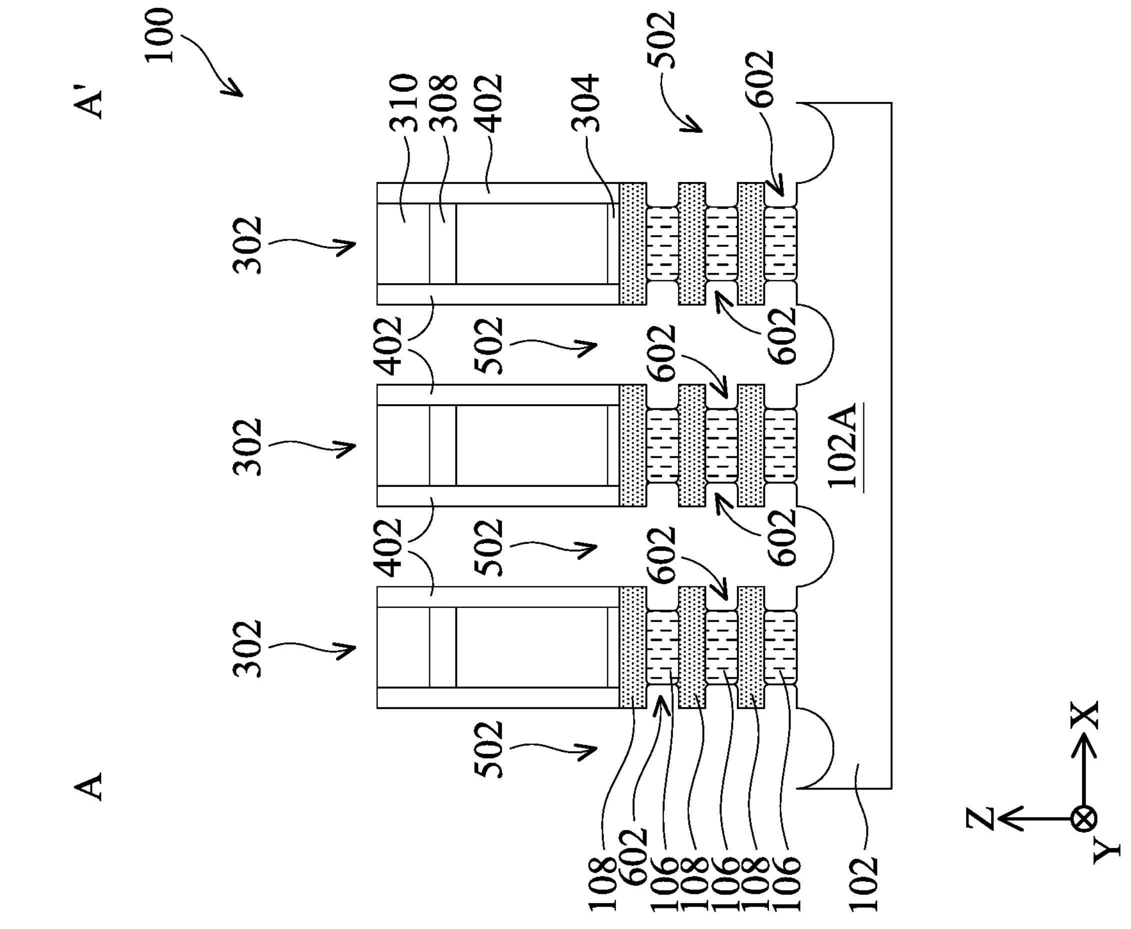
Figure 6B:
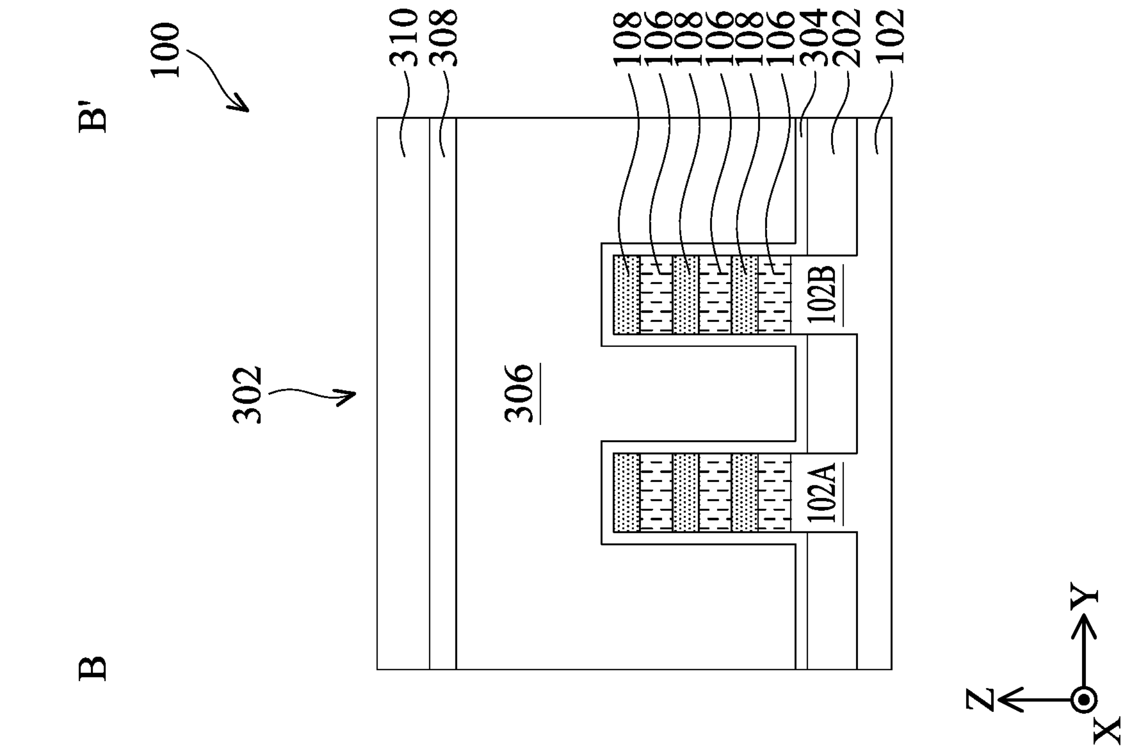

Referring to FIGS. 6A and 6B, the semiconductor layers 106 exposed in the source/drain trenches 502 are partially recessed by a selective etching process, in accordance with some embodiments. Specifically, the selective etching process is performed that selectively etches the side portions of the semiconductor layers 106 below the gate spacers 402 through the source/drain trenches 502, with minimal (to no) etching of semiconductor layers 108. After the selective etching process, inner spacer recesses 602 are formed between the semiconductor layers 108 as well as between the semiconductor layers 108 and the substrate 102, below the gate spacers 402. The selective etching process is configured to laterally etch (e.g., along the X-direction) the semiconductor layers 106 below the gate spacers 402. The selective etching process may be a dry etching process, a wet etching process, other suitable etching process, or combinations thereof.

In some embodiments, the semiconductor layers 108 are also etched during the selective etching process and the inner spacer recesses 602 partially extend in the Z-direction into the semiconductor layers 108, as shown in FIG. 6A. In some embodiments, the semiconductor layers 108 include curved top surfaces and curved bottom surface exposed by the inner spacer recesses 602.

Figure 7B:
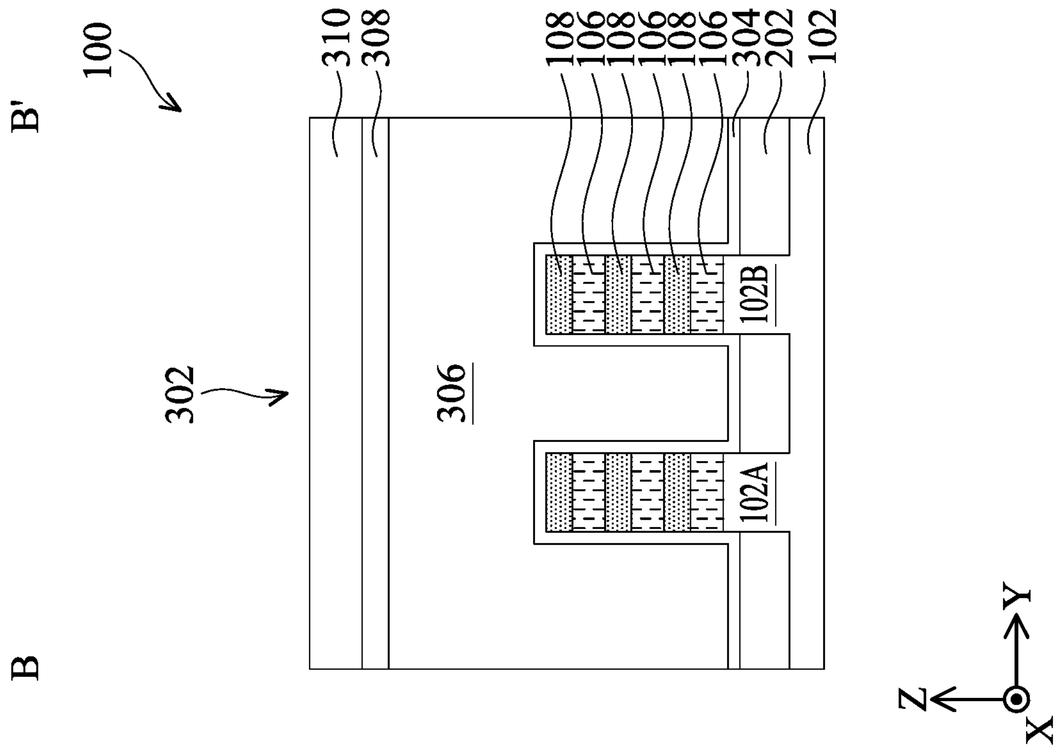
Figure 7A:
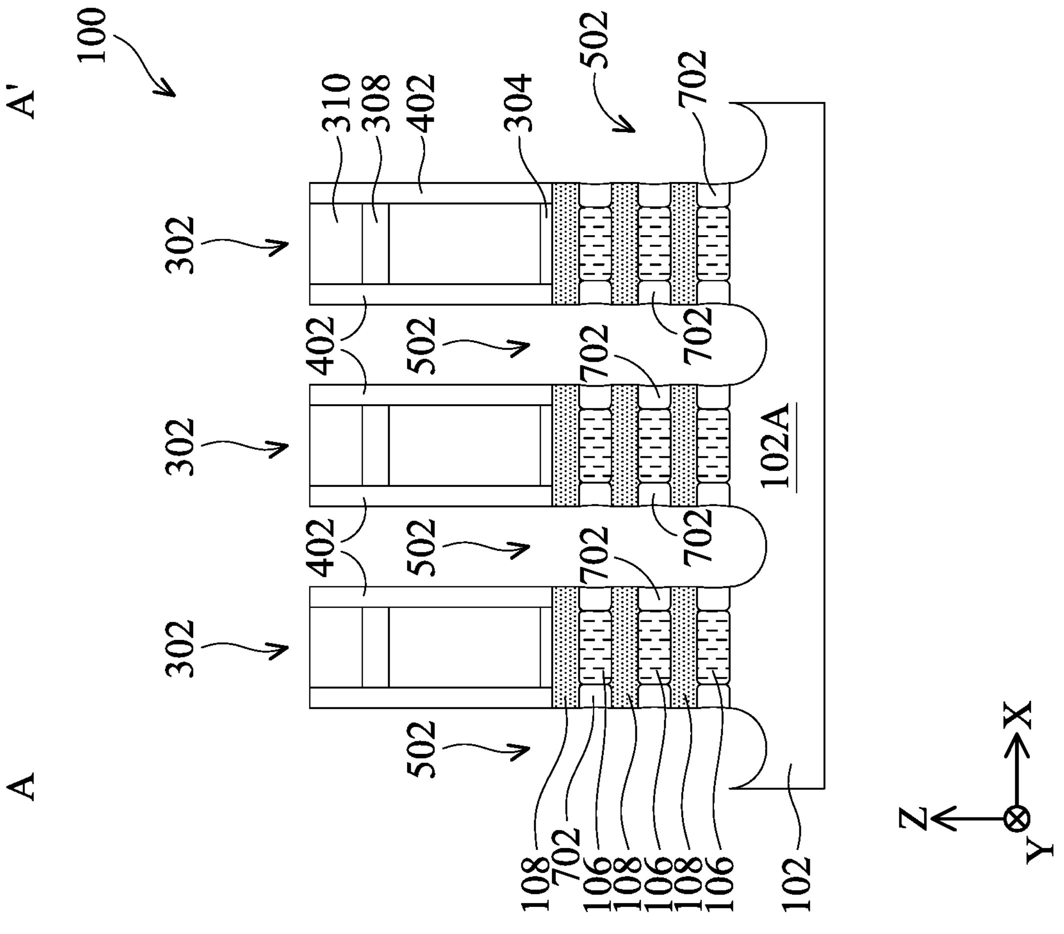

Referring to FIGS. 7A and 7B, inner spacers 702 are formed in the inner spacer recesses 602 to fill the inner spacer recesses 602, in accordance with some embodiments. In some embodiments, sidewalls of the inner spacers 702 have concave surfaces exposed by the source/drain trenches 502 due to the etching process described below, as shown in FIG. 7A. In some other embodiments, sidewalls of the inner spacers 702 are aligned to the sidewalls of the gate spacers 402 and the semiconductor layers 108.

In order to form the inner spacers 702, a deposition process is performed to form a spacer layer into the source/drain trenches 502 and the inner spacer recesses 602. For example, the deposition process may be CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 502. The deposition process is configured to ensure that the spacer layer fills the inner spacer recesses 602 between the semiconductor layers 108 as well as between the semiconductor layer 108 and the substrate 102 under the gate spacers 402. An etching process is then performed that selectively etches the spacer layer to form inner spacers 702 (as shown in FIG. 7A) with minimal (to no) etching of the semiconductor layer 108, the substrate 102, the dummy gate structures 302, and the gate spacers 402.

The spacer layer (and thus inner spacers 702) may include a material that is different than a material of the semiconductor layers 108 and a material of the gate spacers 402 to achieve desired etching selectivity during the etching process. In some embodiments, the inner spacers 702 include a low-k dielectric material (e.g., the material has a dielectric constant that is less than a dielectric constant of silicon dioxide (e.g., $k<3.9$)). For example, the low-k dielectric material may include Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, the inner spacers 702 include a dielectric material having a dielectric constant that is less than about 2.5 (i.e., an extreme low-k (ELK) dielectric material). For example, the ELK dielectric material may include $SiO_2$ (e.g., porous silicon dioxide), silicon carbide (SiC), and/or carbon-doped oxide (e.g., a SiCOH-based material (having, for example, Si—$CH_3$ bonds)), each of which is tuned/configured to exhibit a dielectric constant less than about 2.5.

In some embodiments, since each of the inner spacers 702 is formed into each of the inner spacer recesses 602, shapes of each inner spacer 702 track those of the corresponding inner spacer recess 602 defined by the semiconductor layers 106 and 108. That is, each of the inner spacers 702 has corresponding curved top and bottom surfaces connected with the semiconductor layers 108.

Figure 8A:
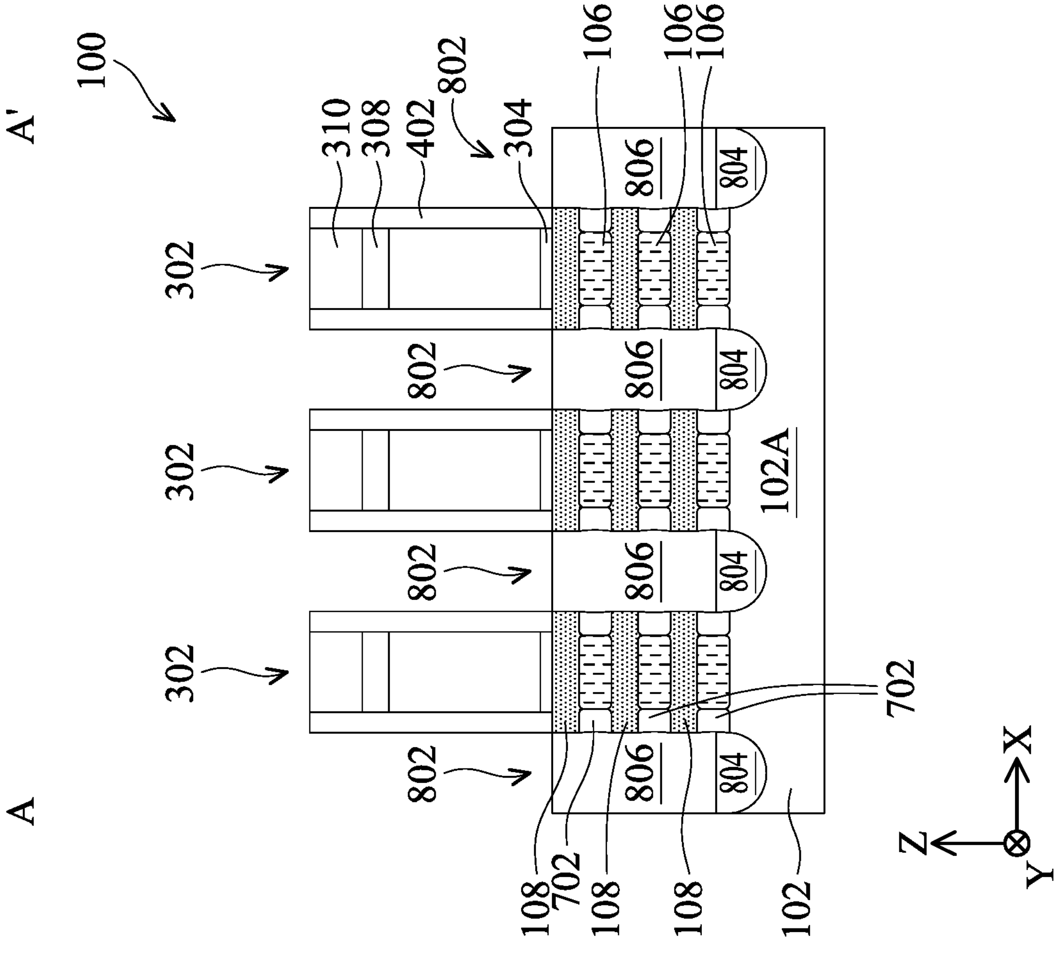
Figure 8B:
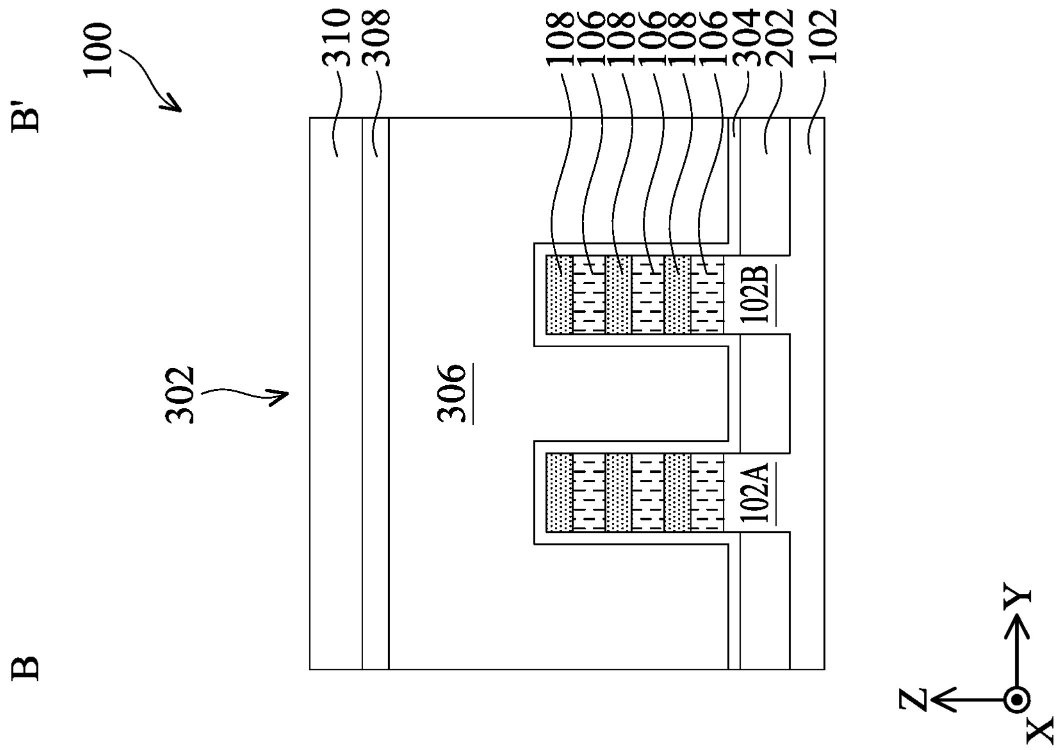

Referring to FIGS. 8A and 8B, source/drain features 802 are formed in the source/drain trenches 502, in accordance with some embodiments. The source/drain features 802 pass through the semiconductor layers 108 and are in the fin structures 112. The source/drain features 802 are also formed on opposite sides of the dummy gate structures 302 in the X-direction. In some embodiments, the source/drain features 802 are connected to and in contact with the semiconductor layers 108. That is, the source/drain features

802 are attached to opposite sides of the semiconductor layers 108. In some aspects, the semiconductor layers 108 serve as channels to connect one source/drain feature 802 to another source/drain feature 802. Therefore, the semiconductor layers 108 may also be referred to as channels, channel layers, or channel members. In some embodiments, the top surfaces of the source/drain features 802 are substantially level with the top surfaces of the topmost semiconductor layers 108 (i.e., substantially coplanar). In other embodiments, the source/drain features 802 may have top surfaces that extend higher than the top surfaces of the topmost semiconductor layers 108 (e.g., in the Z-direction).

In some embodiments, each of the source/drain features 802 includes an undoped epitaxial layer 804 and a doped epitaxial layer 806 over the undoped epitaxial layer 804. The undoped epitaxial layers 804 are formed in bottom portions of source/drain trenches 502. The undoped epitaxial layers 804 are substantially free of dopants. The undoped epitaxial layers 804 may include silicon, germanium, silicon germanium, other suitable semiconductor materials, or combinations thereof. In some embodiments, the undoped epitaxial layers 804 include silicon that is substantially free of n-type dopants and p-type dopants. In some embodiments, the top surfaces of the undoped epitaxial layers 804 are higher than the top surface of the substrate 102 and lower than the top surfaces of the bottommost inner spacers 702. In some embodiments, the top surfaces of the undoped epitaxial layers 804 are at a height approximately in the middle of the bottommost inner spacers 702 (e.g., in the Z-direction).

The doped epitaxial layers 806 are formed over the undoped epitaxial layers 804 to fill the source/drain trenches 502. In some embodiments, the doped epitaxial layers 806 are attached to opposite sides of the semiconductor layers 108. The doped epitaxial layers 806 may include any suitable semiconductor materials. For example, the doped epitaxial layers 806 for n-type GAA transistors may include silicon (Si), silicon carbide (SiC), silicon phosphide (SiP), silicon arsenide (SiAs), silicon phosphoric carbide (SiPC), or combinations thereof. For example, the doped epitaxial layers 806 for p-type GAA transistors may include silicon (Si), silicon germanium (SiGe), germanium (Ge), silicon germanium carbide (SiGeC), or combinations thereof.

One or more epitaxy processes may be employed to grow the source/drain features 802 (i.e., the undoped epitaxial layers 804 and the doped epitaxial layers 806). The epitaxy processes can implement CVD deposition techniques (e.g., vapor-phase epitaxy (VPE), UHVCVD, LPCVD, and/or PECVD), molecular beam epitaxy (MBE), other suitable selective epitaxial growth (SEG) processes, or combinations thereof. The source/drain features 802 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. The source/drain features 802 may also be referred to as source/drain, or source/drain regions. In some embodiments, source/drain feature(s) 802 may refer to a source or a drain, individually or collectively dependent upon the context. In some embodiments, the source/drain features 802 for n-type transistors may be referred to as n-type source/drain features and the source/drain features 802 for p-type transistors may be referred to as p-type source/drain features. In some embodiments, one or more annealing processes may be performed to activate the dopants in the source/drain features 802. The annealing processes may include rapid thermal annealing (RTA) and/or laser annealing processes.

Figure 9B:
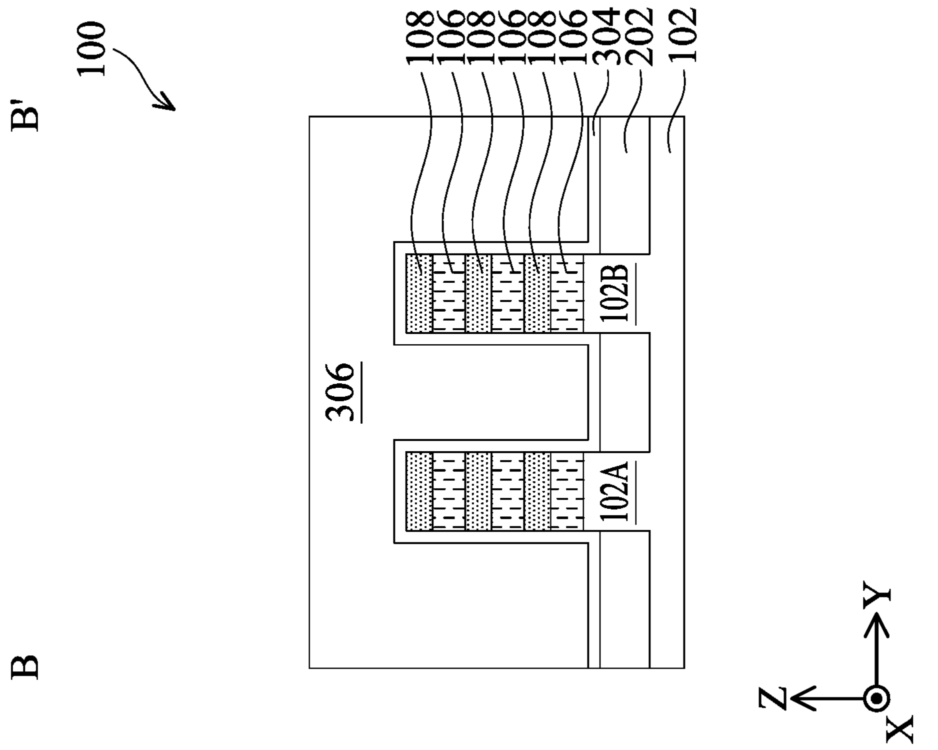
Figure 9A:
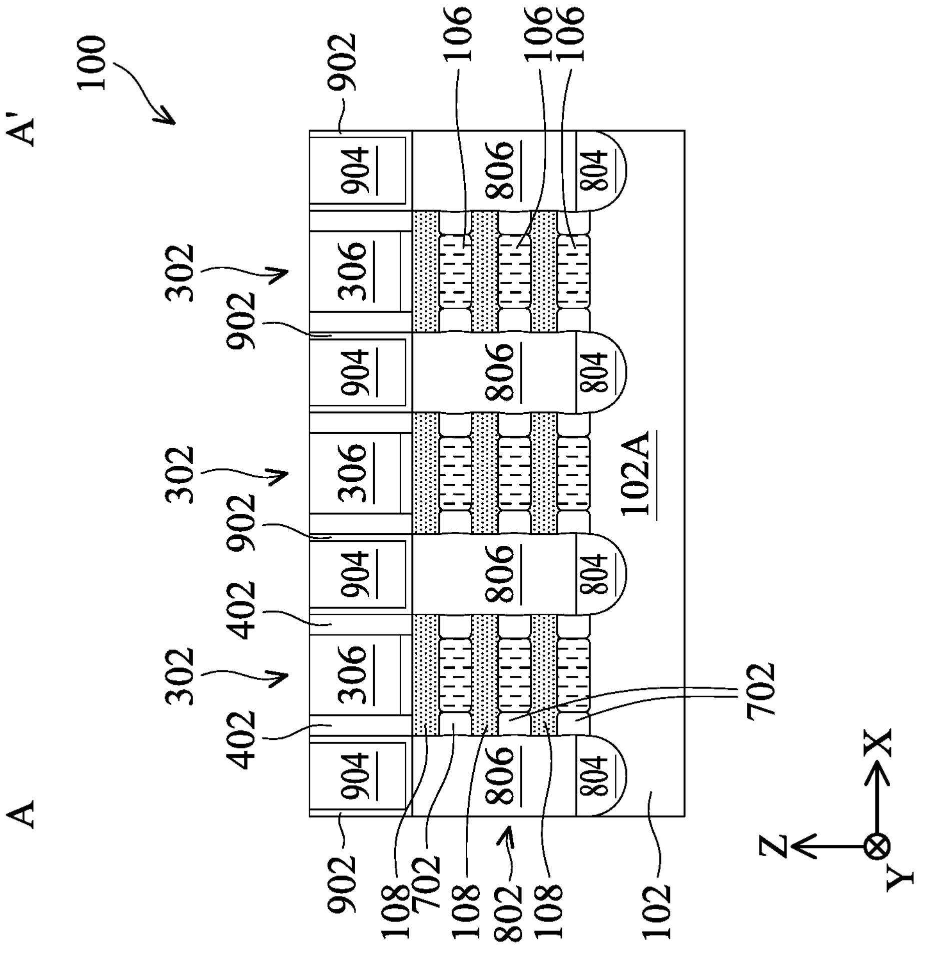

Referring to FIGS. 9A and 9B, a contact etch stop layer (CESL) 902 over the source/drain features 802 and an interlayer dielectric (ILD) layer 904 over the CESL 902 are formed to fill the space between the gate spacers 402, in accordance with some embodiments. Specifically, in some embodiments, the CESL 902 is conformally formed on the sidewalls of the gate spacers 402 and over the top surfaces of the source/drain features 802, as shown in FIG. 9A. The ILD layer 904 is formed over and between the CESL 902 to fill the space between the CESL 902 or between the gate spacers 402.

The CESL 902 includes a material that is different than ILD layer 904. The CESL 902 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The CESL 902 may be formed by CVD, PVD, ALD, or other suitable methods. The ILD layer 904 may include tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 904 may be formed by PECVD, FCVD, or other suitable methods.

Subsequent to the deposition of the CESL 902 and the ILD layer 904, a CMP process and/or other planarization process is performed on the CESL 902, the ILD layer 904, the gate spacers 402, and the hard mask layers 308 and 310 until the top surfaces of the dummy gate electrode layers 306 are exposed. In some embodiments, portions of the dummy gate electrode layers 306 are removed after the planarization process. In some embodiments, the ILD layer 904 is recessed to a level below the top surfaces of the dummy gate electrode layers 306, and then an ILD protection layer is formed over the ILD layer 904 to protect the ILD layer 904 from subsequent etching processes. As such, the ILD layer 904 is surrounded by the CESL 902 and the ILD protection layer. In some embodiments, the ILD protection layer includes a material that is the same as or similar to that in the CESL 902. In some other embodiments, the ILD protection layer includes a dielectric material such as $Si_3N_4$, SiCN, SiOCN, SiOC, a metal oxide such as $HrO_2$, $ZrO_2$, hafnium aluminum oxide, hafnium silicate, or other suitable material, and may be formed by CVD, PVD, ALD, or other suitable methods.

Figure 10B:
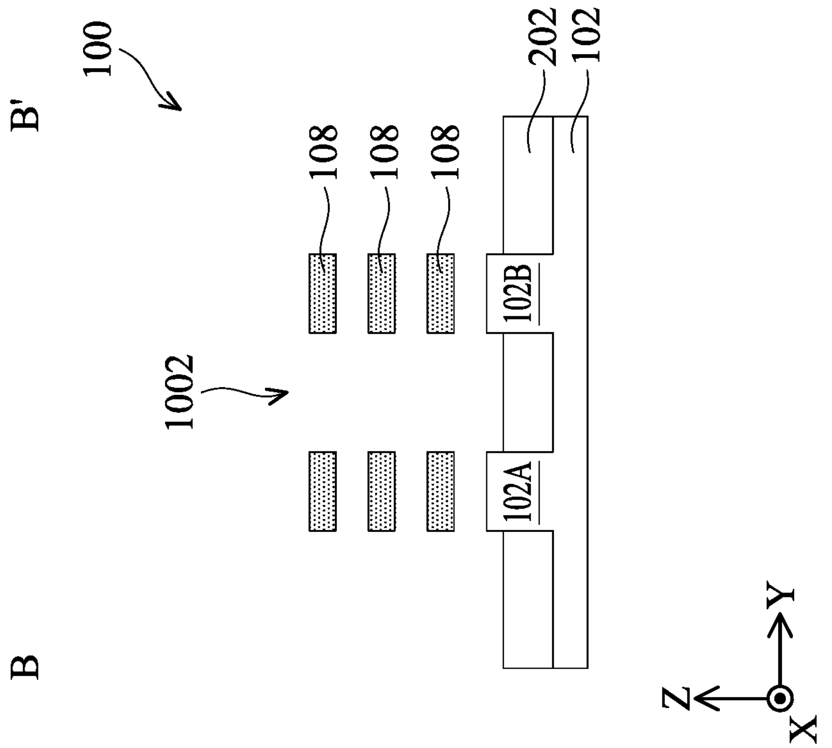
Figure 10A:
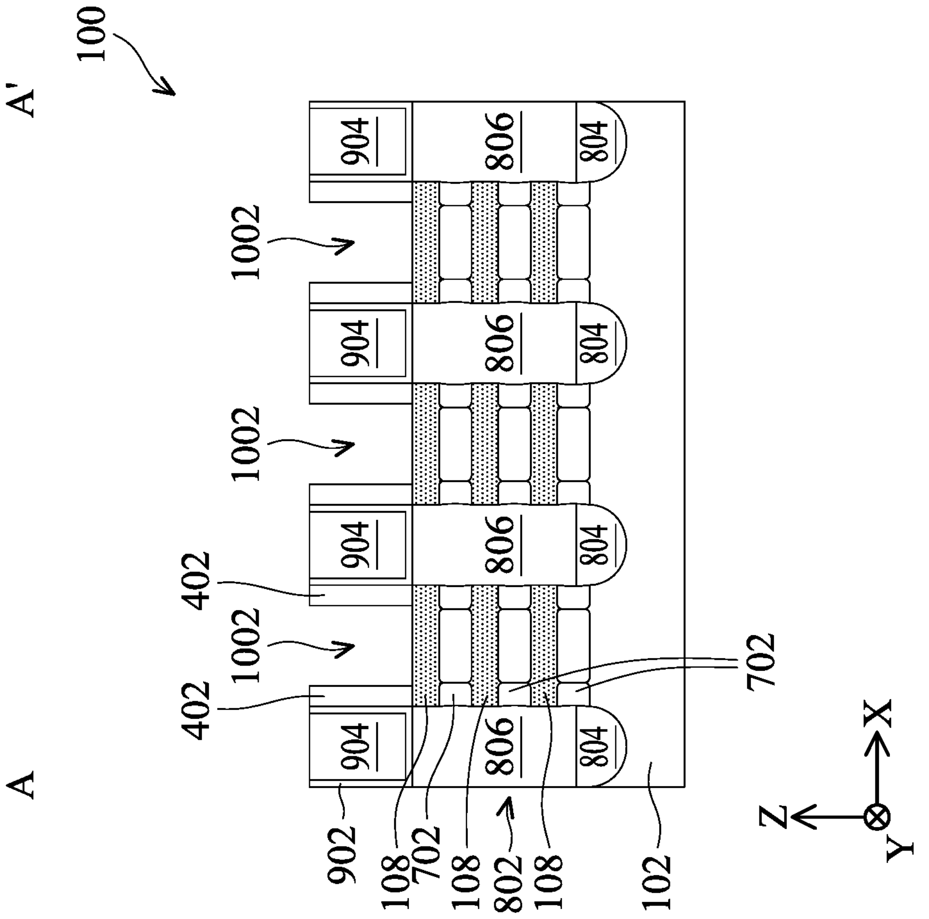

Referring to FIGS. 10A and 10B, the dummy gate structures 302 are selectively removed through any suitable lithography and etching processes to form gate trenches 1002, in accordance with some embodiments. In some embodiments, the lithography process may include forming a photoresist layer, exposing the photoresist to a pattern, performing a post-exposure bake process, and developing the photoresist to form a masking element, which exposes a region including the dummy gate structures 302. Then, the dummy gate structures 302 are selectively etched through the masking element. The gate spacers 402 may be used as the masking element or a part thereof. Etch selectivity may be achieved by selecting the appropriate etching chemicals, and the dummy gate electrode layers 306 may be removed without substantially affecting the CESL 902 and the ILD layer 904. The removal of the dummy gate structures 302 creates the gate trenches 1002, in which the gate trenches 1002 expose the top surfaces of the fin structures 112

(specifically, the top surfaces of the topmost semiconductor layers 108) and the isolation structure 202.

Still referring to FIGS. 10A and 10B, the semiconductor layers 106 of the fin structures 112 are selectively removed through the gate trenches 1002, using a wet or dry etching process for example, in accordance with some embodiments. After the fin structures 112 are selectively removed, the semiconductor layers 108 are exposed in the gate trenches 1002 to form nanostructures stacked over each other. The nanostructures serve as channels, channel layers, or channel members for resultant transistors. As such, the semiconductor layers 108 may be referred to as nanostructures. Specifically, the semiconductor layers 108 are stacked over each other in the Z-direction. More specifically, the semiconductor layers 108 are suspended over and vertically arranged over the substrate 102 in the Z-direction, and constitute vertical stacks.

Such a process may also be referred to as a release process, a channel release process, a wire release process, a nanowire release process, a nanosheet release process, a nanowire formation process, a nanosheet formation process, a sheet formation process, or a wire formation process. In some embodiments, the removal of the semiconductor layers 106 causes the exposed semiconductor layers 108 to be spaced apart from each other in the vertical direction (e.g., in the Z-direction). The exposed semiconductor layers 108 extend longitudinally in the horizontal direction (e.g., in the X-direction). Furthermore, each of the semiconductor layers 108 connects one source/drain feature 802 to another source/drain feature 802.

In some embodiments, thicknesses of the semiconductor layers 108 exposed in the gate trenches 1002 may be reduced during the removal of the semiconductor layers 106. In some embodiments, the semiconductor layers 108 exposed in the gate trenches 1002 are also etched to have arc-shaped surfaces due to the etching process for removing the semiconductor layers 106. In other embodiments, heights of the base fins 102A and 102B in the gate trenches 1002 may also be reduced during the removal of the semiconductor layers 106. Furthermore, the thickness of the isolation structure 202 exposed in the gate trenches 1002 may also be reduced during the removal of the semiconductor layers 106.

Figure 11B:
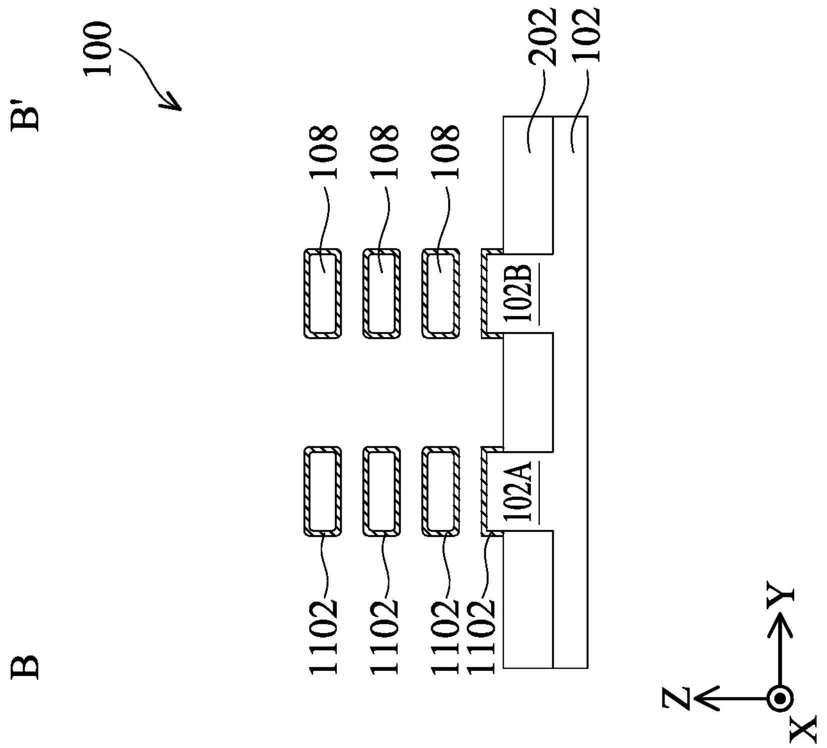
Figure 11A:
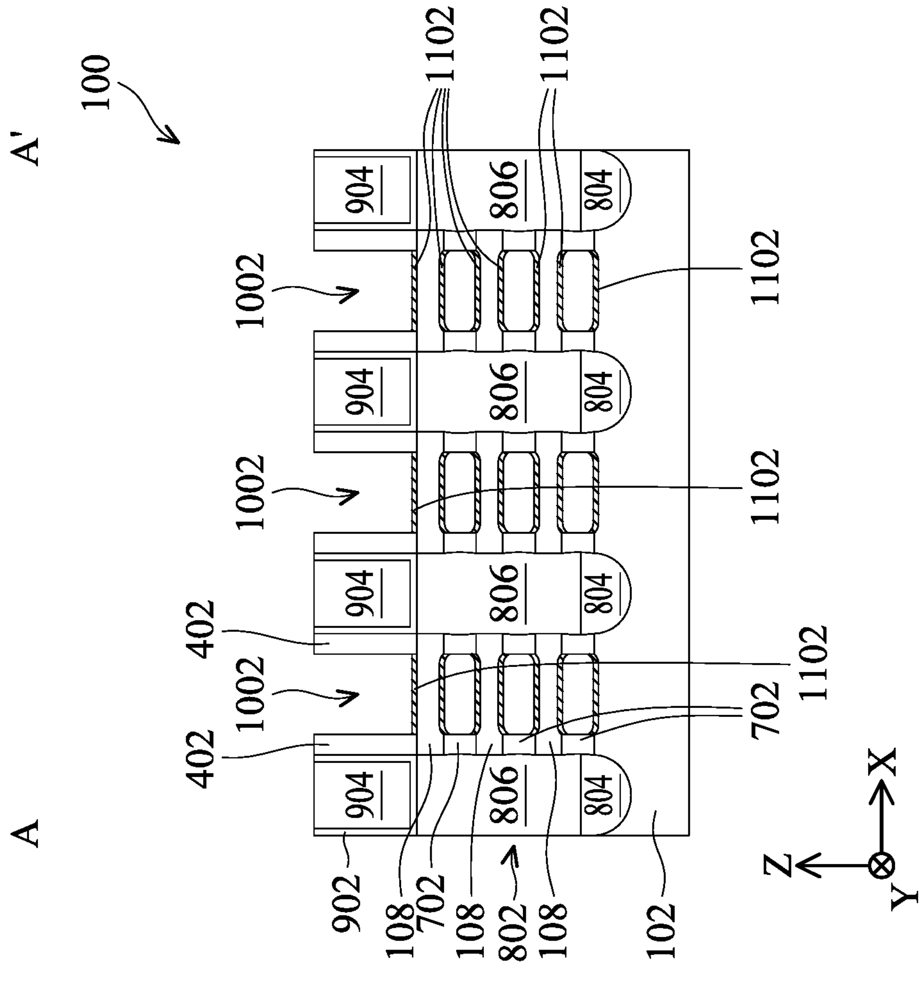

Referring to FIGS. 11A and 11B, interfacial layers 1102 are formed in the gate trenches 1002 and on the surfaces of the semiconductor layers 108 to wrap around the exposed semiconductor layers 108, in accordance with some embodiments. In some embodiments, the interfacial layers 1102 are also formed on the surfaces of base fins 102A and 102B exposed from the isolation structure 202. In some embodiments, the interfacial layer 1102 may include a dielectric material such as silicon oxide ($SiO_2$), hafnium silicate, or silicon oxynitride (SiON). The interfacial layer 1102 may be formed by chemical oxidation, thermal oxidation, ALD, CVD, and/or other suitable method.

Figure 12B:
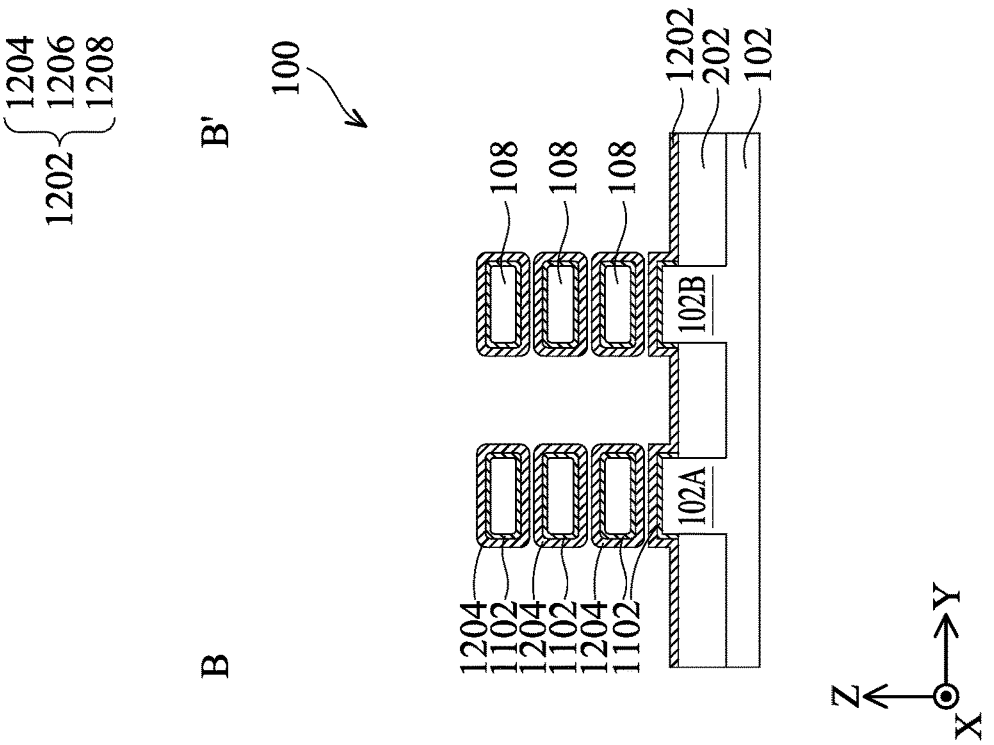
Figure 12A:
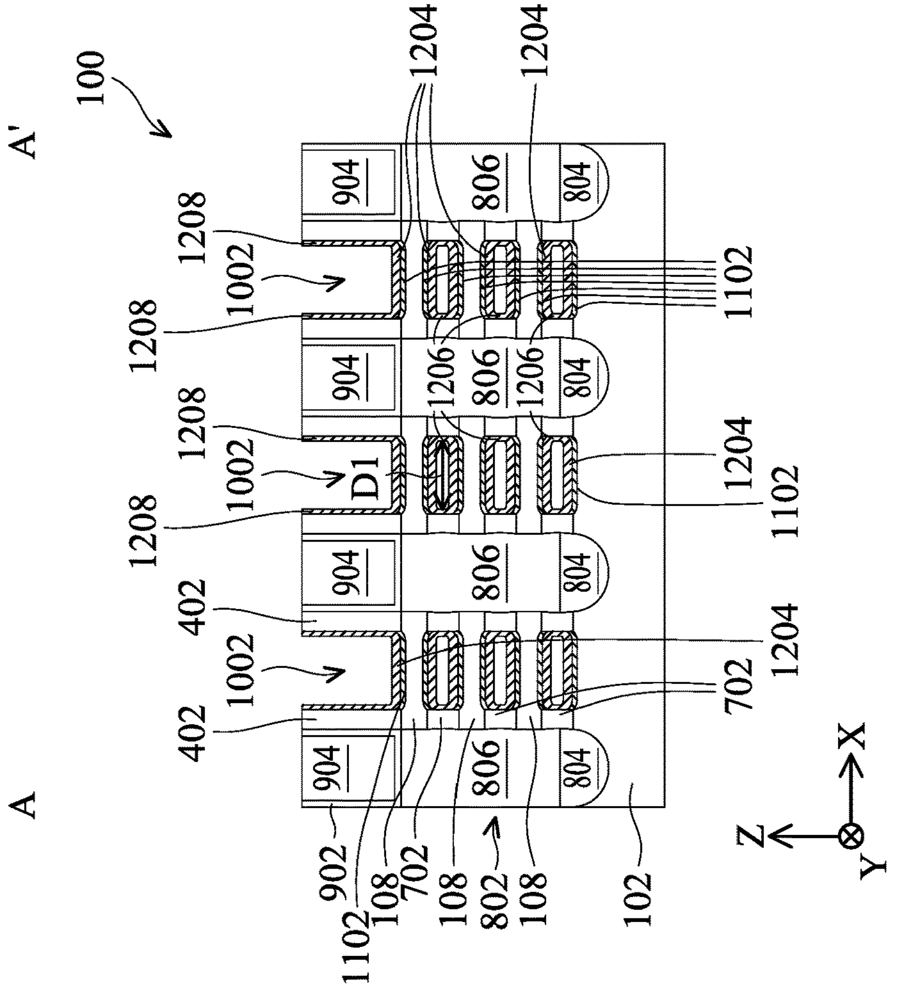

Referring to FIGS. 12A and 12B, gate dielectric material layers 1202 are formed in the gate trenches 1002, in accordance with some embodiments. The gate dielectric material layers 1202 include portions 1204 formed on the interfacial layers 1102, portions 1206 formed on the sidewalls of the inner spacers 702, and portions 1208 formed on the gate spacers 402. The portions 1204 of the gate dielectric material layers 1202 wrap around the semiconductor layers 108 and the interfacial layers 1102 are interposed between the gate dielectric material layers 1202 and semiconductor layers 108. In some embodiments, the interfacial layers 1102 are omitted. In these embodiments, the portions 1204 of the gate dielectric material layers 1202 are formed on the surfaces of and wrap around the semiconductor layers 108 directly.

The gate dielectric material layers 1202 may include a high-k dielectric material having a dielectric constant greater than a dielectric constant of $SiO_2$, which is approximately 3.9. For example, the gate dielectric material layers 1202 may include hafnium oxide ($HfO_2$), which has a dielectric constant in a range from about 18 to about 40. Alternatively, the gate dielectric material layers 1202 may include other high-k dielectric materials, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (BTO), $BaTiO_3$ (BTO), BaZrO, HfLaO, HfSiO, LaSiO, AlSiO, HfTaO, HfTiO, (Ba, Sr) $TiO_3$ (BST), $Al_2O_3$, $Si_3N_4$, oxynitrides (SiON), combinations thereof, or other suitable material. The gate dielectric material layers 1202 may be formed by ALD, PVD, CVD, oxidation, and/or other suitable methods.

Since the growth rate of growing the high-k dielectric material (i.e., the gate dielectric material layers 1202) on the low-k dielectric material is much lower than the growth rate of growing the high-k dielectric material on the interfacial layer and semiconductor layer, portions 1206 formed on the sidewalls of the inner spacers 702 (i.e., low-k dielectric material) and portions 1208 formed on sidewalls of the gate spacers 402 (if the gate spacers 402 are also formed by low-k dielectric material) are thinner than the portions 1204 formed on the interfacial layers 1102 or the semiconductor layers 108. In some embodiments, the portions 1206 and the portions 1208 are thinner than the portions 1204 formed on the interfacial layers 1102, as shown in FIG. 12A.

Figure 13B:
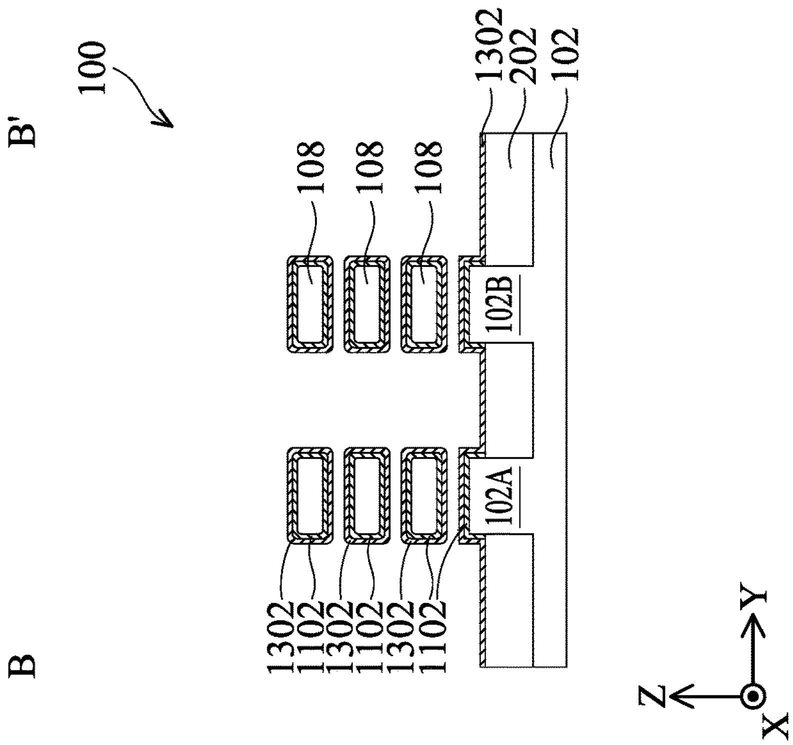
Figure 13A:
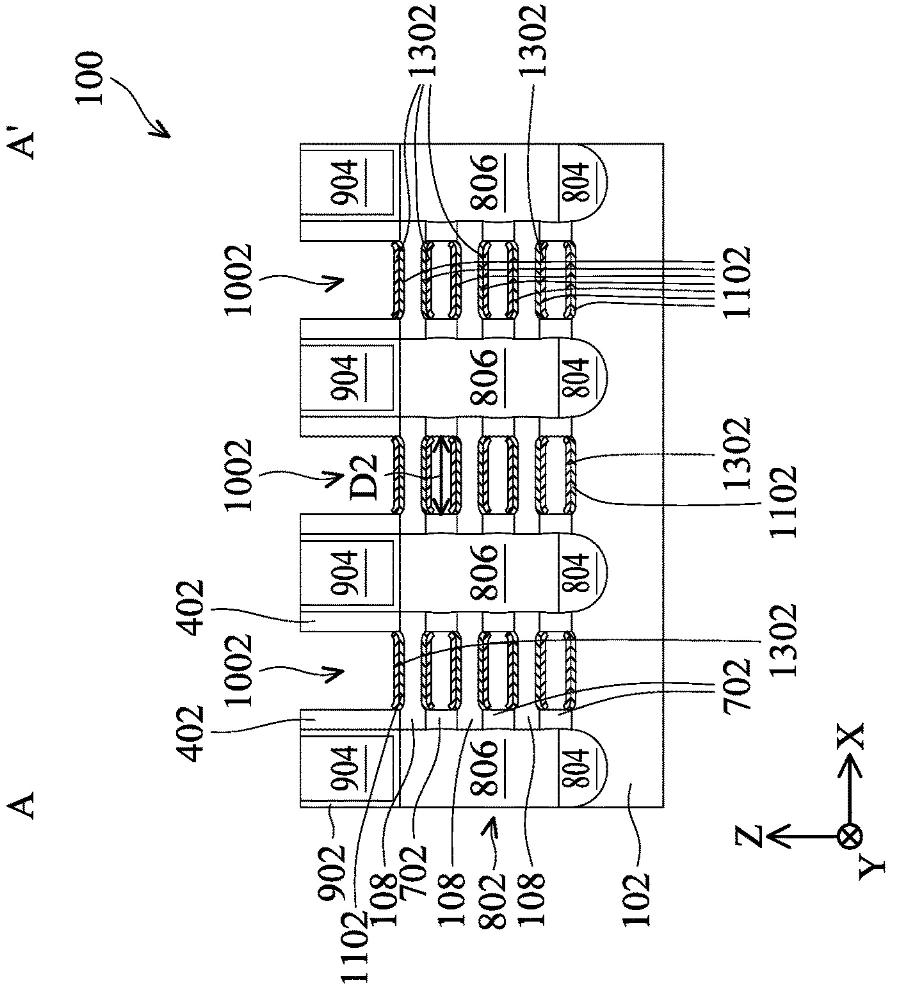

Referring to FIGS. 13A and 13B, the gate dielectric material layers 1202 are slimmed (e.g. partially removed) to form gate dielectric layers 1302, in accordance with some embodiments. The gate dielectric layers 1302 wrap around each of the semiconductor layers 108. As described above, the portions 1206 (and portions 1208 in some embodiments) are thinner than portions 1204. Therefore, in an etching process, the portions 1206 and portions 1208 can be partially or completely removed, while the portions 1204 formed on the interfacial layers 1102 or the semiconductor layers 108 still remain enough thickness to function as gate dielectric layers. That is, portions 1206 formed on sidewalls of the inner spacers 702 and the portions 1208 formed on sidewalls of the gate spacers 402 are slimmed to increase (enlarge) the space between the inner spacers 702 and the space between the gate spacers 402. Moreover, although the portions 1204 formed on the interfacial layers 1102 or the semiconductor layers 108 are also slimmed, the portions 1204 still has enough thickness to function as gate dielectric layer.

In some embodiments, the portions 1206 formed on sidewalls of the inner spacers 702 and the portions 1208 formed on sidewalls of the inner spacers 702 are completely remove, as shown in FIG. 13A. The portions 1204 formed on interfacial layers 1102 are partially removed, and the remaining portions of the portions 1204 form gate dielectric layers 1302. In some embodiments, the portions 1206 and 1208 are not completely removed, and the remaining portions of the portions 1206 and 1208 form gate dielectric layers 1302 with the remaining portions of the portions 1204. In these embodiments, although the portions 1206 and 1208 still have remainders, the removed portions of the portions 1206 and 1208 still enlarge the space between the inner spacers 702 and the space between the gate spacers 402. In other embodiments, the portions 1206 are completely removed and the portions 1208 are partially removed. In certain embodiments, the portions 1208 are completely removed and the portions 1206 are partially removed.

Referring to FIG. 12A again, there is a distance D1 extending in X-direction in the gate trench 1002 and between a pair of the portions 1206 formed on a pair of the inner spacers 702, in accordance with some embodiments. If the portions 1206 are not slimmed, the distance D1 corresponds to a gate length of the completed semiconductor structure 100. Referring to FIG. 13A now, there is a distance D2 extending in X-direction in the gate trench 1002 and between a pair of the inner spacers 702, in accordance with some embodiments. Since the portions 1206 are slimmed to enlarge the space between the inner spacers 702, the distance D2 corresponding to the gate length of the completed semiconductor structure 100 is greater than the distance D1. In other words, by slimming the portions 1206, the gate length of the semiconductor structure 100 can be increased. In some embodiments, it can also be applied to the portions 1208 formed on gate spacers 402. In the embodiments where the portions 1206 and/or portions 1208 are not removed completely, the portions of the portions 1206 and/or portions 1208 being removed still enlarge the space, and thus the gate length still can be increased.

The gate dielectric material layers 1202 (including portions 1204, 1206, and 1208) may be partially removed by an etching process. The etching process may include a dry etching process, a wet etching process, other suitable etching processes, or combinations thereof. In some embodiments, the etching process is the wet etching process, such as dilute hydrogen fluoride (dilute HF), SPM (a sulfuric peroxide mixture), and APM (ammonia hydroxide-hydrogen peroxide-water mixture).

The thicknesses of the gate dielectric material layers 1202 may be adjusted by selecting the material of the inner spacers 702 and/or the gate spacers 402. Accordingly, the thicknesses of the gate dielectric layers 1302 are also adjusted because the gate dielectric layers 1302 are formed by etching the gate dielectric material layers 1202. Since the growth rates of growing high-k dielectric material on different materials are different, the thicknesses of portions 1206 formed on the inner spacers 702 and portions 1208 formed on the gate spacers 402 can be adjusted by selecting the materials of the inner spacers 702 and the gate spacers 402.

In some embodiments, a material with lower high-k dielectric material growth rate is selected for forming the inner spacers 702 and/or gate spacers 402. In these embodiments, the portions 1206 and/or 1208 that are formed have thinner thicknesses, and thus the thickness difference between the portions 1206 and/or 1208 and the portions 1204 is greater. Accordingly, the portions 1206 and/or 1208 can be completely removed during the etching process, while the remaining portions of the portions 1204 are still thick enough to function as gate dielectric layers 1302. Alternatively, the remaining portions of the portions 1204 can be thicker after completely removing the portions 1206 and/or 1208, thereby forming thicker gate dielectric layers 1302.

In other embodiments, a material with higher high-k dielectric material growth rate is selected for forming the inner spacers 702 and/or gate spacers 402. In these embodiments, the portions 1206 and/or 1208 that are formed have thicker thicknesses, and thus the thickness difference between the portions 1206 and/or 1208 and the portions 1204 is smaller. Accordingly, the portions 1206 and/or 1208 can be partially removed during the etching process, and the remaining portions of the portions 1206 and/or 1208 can form gate dielectric layers 1302 with the remaining portions of the portions 1204. Alternatively, the remaining portions of the portions 1204 can be thinner after completely removing the portions 1206 and/or 1208, thereby forming thinner gate dielectric layers 1302.

In certain embodiments, the thicknesses of the gate dielectric material layers 1202 may be adjusted by modifying the ratio of elements in the material of inner spacers 702 and/or gate spacers 402. For example, when the material of the inner spacers 702 and/or the gate spacers 402 is SiCOH, the ration of elements C, O, and H can be modified, so as to adjust the growth rate of forming the portions 1206 and/or portions 1208 on the inner spacers 702 and/or the gate spacers 402.

Figure 14B:
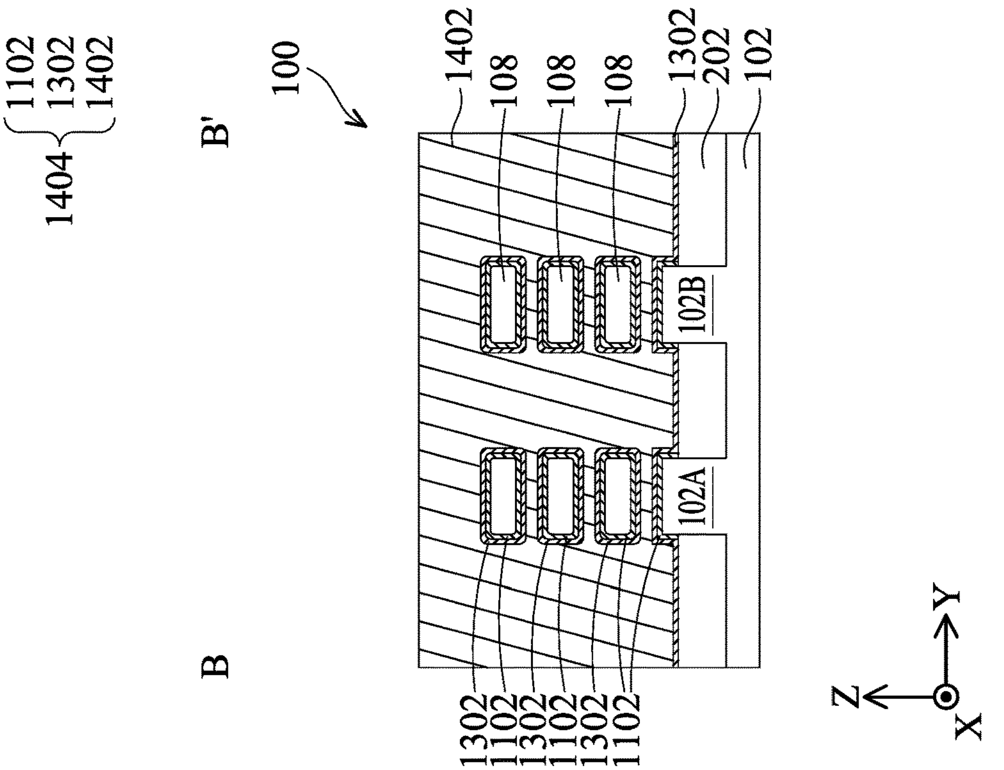
Figure 14A:
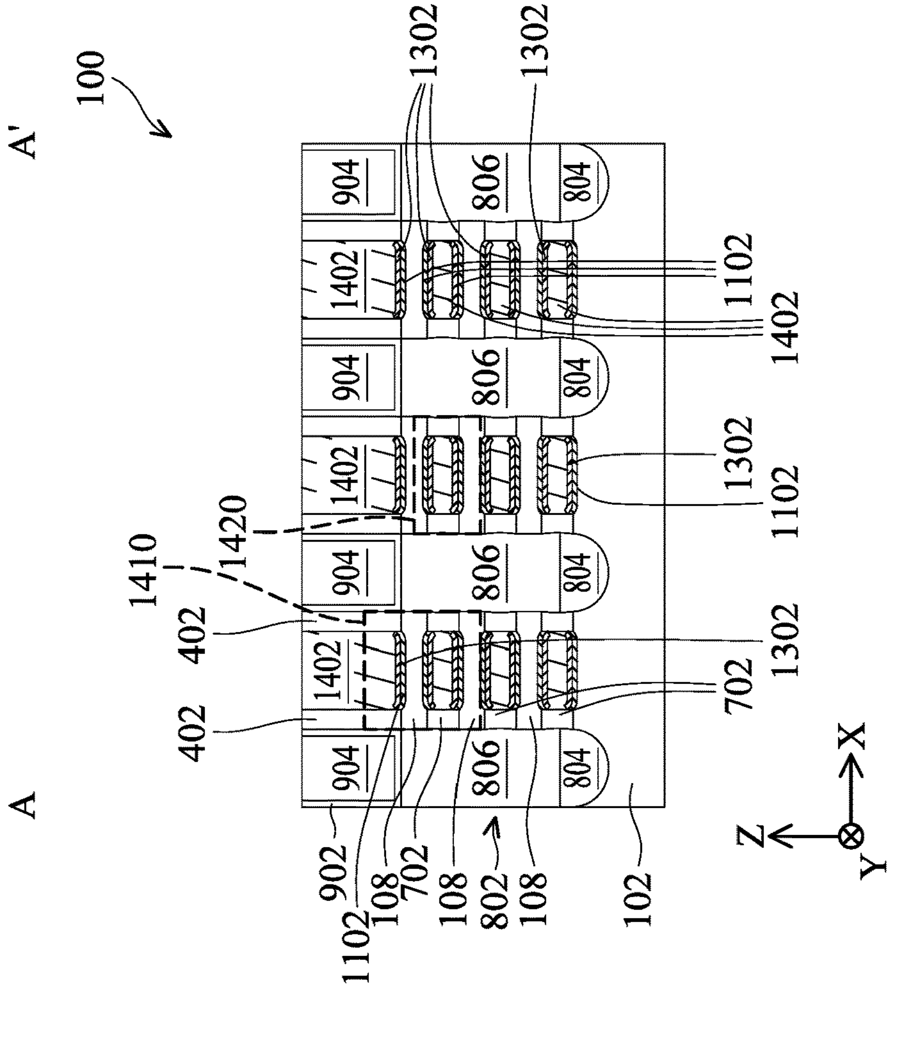

Referring to FIGS. 14A and 14B, gate electrode layers 1402 are formed in the gate trenches 1002 to fill the remaining spaces of the gate trenches 1002 and over the gate dielectric layers 1302, in accordance with some embodiments. In some embodiments, the gate electrode layers 1402 wrap around the semiconductor layers 108, the gate dielectric layers 1302, and the interfacial layers 1102 (if present). In the embodiments where the portions 1206 and/or portions 1208 are completely removed, the gate electrode layers 1402 contact with the inner spacers 702 and/or gate spacers 402 directly, as shown in FIG. 14A. In the embodiments where the portions 1206 and/or portions 1208 are partially removed, the gate electrode layers 1402 contact with the remaining portions of the portions 1206 and/or portions 1208 that function as parts of the gate dielectric layers 1302. In these embodiments, the gate electrode layers 1402 are separated from the inner spacers 702 and/or gate spacers 402 by the remaining portions of the portions 1206 and/or portions 1208.

The interfacial layers 1102, the gate dielectric layers 1302 formed on the interfacial layers 1102, and the gate electrode layers 1402 formed on the gate dielectric layers 1302 constitute gate structures 1404 wrapping around each of the semiconductor layers 108. After the gate electrode layers 1402 are formed, the dummy gate structures 302 are replaced by the gate structures 1404. In some embodiments, the gate structures 1404 extend in the Y-direction, as shown in FIG. 14B. The source/drain features 802 are formed on opposite sides of the gate structures 1404 in the X-direction. In some embodiments, the inner spacers 702 are formed on opposite sides of the gate structures 1404 in the X-direction, and between the semiconductor layers 108 and separating the semiconductor layers 108 from each other in the Z-direction. In some embodiments, the gate spacers 402 are formed on the opposite sides of the gate structures 1404 in the X-direction, and over the topmost one of the semiconductor layers 108 in the Z-direction, as shown in FIG. 14A.

The gate electrodes 1402 each may include a single layer or alternatively a multi-layer structure. In some embodiments, the gate electrodes 1402 each may include a capping layer, a barrier layer, work function metal layers, and a fill material. The gate structures may be formed using a deposition process such as ALD, CVD, or the like, although any suitable deposition process may be used. The capping layer may be formed of a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like.

The barrier layer may be formed of a material different from the capping layer. In some embodiments, the barrier layer may be formed of a material such as one or more layers of a metallic material. For example, the metallic material may be TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like.

The work function layers may include conductive materials tuned to have a desired work function (such as an n-type work function or a p-type work function), such as n-type work function materials and/or p-type work function materials. In some embodiments, the p-type work function materials include TIN, TaN, Ru, Mo, Al, $ZrSi_2$, $MoSi_2$, $TaSi_2$, $NiSi_2$, WN, other p-type work function materials, or combinations thereof. In some embodiments, the n-type work function materials include Ti, Al, Ag, Mn, Zr, TiAl, TiAlC, TaC, TaCN, TaSiN, TaAl, TaAlC, TiAlN, other n-type work function materials, or combinations thereof. In some embodiments, the fill material may include a suitable conductive material, such as Al, W, and/or Cu.

Figure 15C:
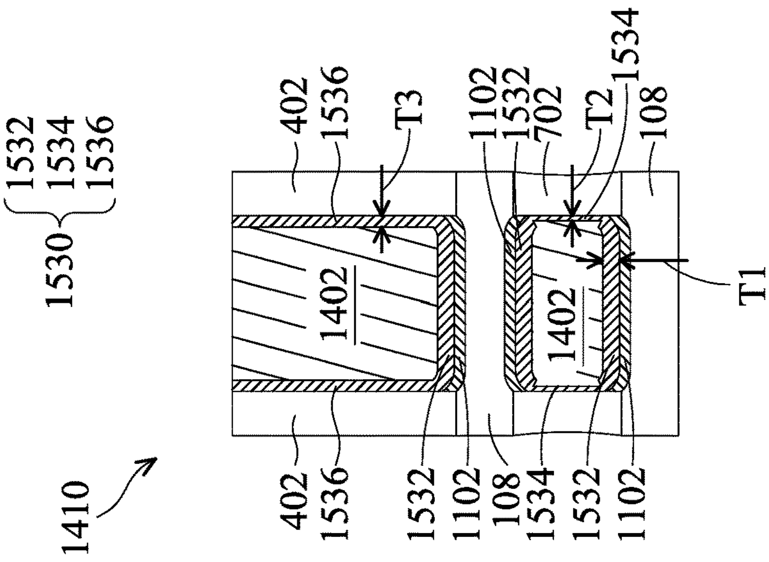
FIGS. 15A to 15C are partial enlarged cross-sectional views of some alternative embodiments of the workpiece of FIG. 14A.
Figure 15B:
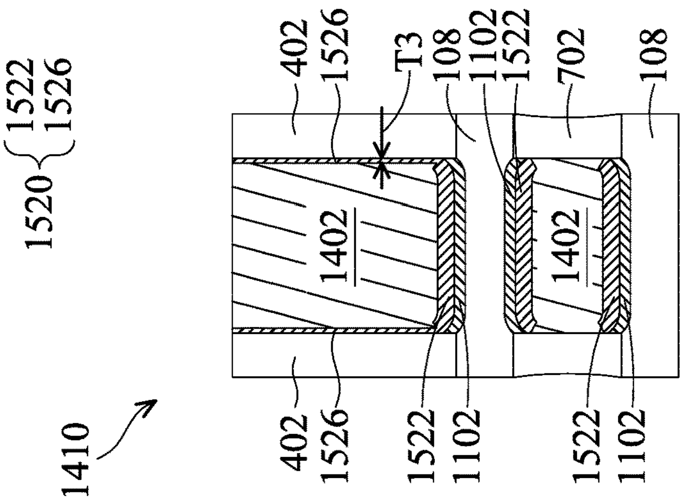
Figure 15A:
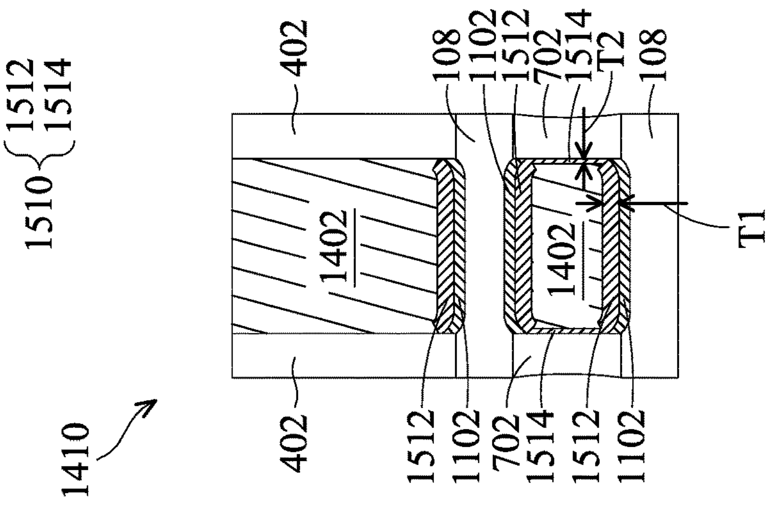

FIGS. 15A to 15C show partial enlarged cross-sectional views of various embodiments of the present disclosure. The structures shown in FIGS. 15A to 15C may be similar to the semiconductor structure 100 shown in FIG. 14A described previously, except the gate dielectric layers shown in FIGS. 15A to 15C are varied with the gate dielectric layers 1302 shown in FIG. 14A in accordance with some embodiments. Processes and materials for forming the semiconductor structures shown in FIGS. 15A to 15C may be similar to, or the same as, those for forming the semiconductor structure 100 described previously and are not repeated herein. For example, the enlarged cross-sectional view shown in FIGS. 15A to 15C may be similar to the block 1410 in the FIG. 14A, and other elements in the semiconductor structure 100 not shown in FIGS. 15A to 15C may be similar to, or the same as, those shown in FIGS. 14A and 14B described previously in accordance with some embodiments.

Referring to FIG. 15A, the gate dielectric layers 1510 include portions 1512 formed on the interfacial layers 1102 and portions 1514 extending from the portions 1512 and formed on sidewalls of the inner spacers 702, in accordance with some embodiments. In the embodiments where the interfacial layers 1102 are omitted, the portions 1512 are formed on the semiconductor layers 108. In some embodiments, the portions 1208 of the gate dielectric material layers 1202 are completely removed from the sidewalls of the gate spacers 402. The portions 1206 of the gate dielectric material layers 1202 are partially removed, and the remaining portions of the portions 1206 turn into portions 1514 of the gate dielectric layers 1510. The portions 1512 have a thickness T1 measured in the Z-direction and the portions 1514 have a thickness T2 measured in the X-direction. In some embodiments, the thickness T1 is greater than the thickness T2. In some embodiments, the thickness T1 is in a range from about 1 nanometer (nm) to 3 nm. In some embodiments, the thickness T2 is less than about 1.5 nm.

Referring to FIG. 15B, the gate dielectric layers 1520 include portions 1522 formed on the interfacial layers 1102 and portions 1526 extending from the portions 1522 and formed on sidewalls of the gate spacers 402, in accordance with some embodiments. In the embodiments where the interfacial layers 1102 are omitted, the portions 1522 are formed on the semiconductor layers 108. In some embodiments, the portions 1206 of the gate dielectric material layers 1202 are completely removed from the sidewalls of the inner spacers 702. The portions 1208 of the gate dielectric material layers 1202 are partially removed, and the remaining portions of the portions 1208 turn into portions 1526 of the gate dielectric layers 1520. The portions 1522 also have the thickness T1 measured in the Z-direction and the portions 1526 have a thickness T3 measured in the X-direction. In some embodiments, the thickness T1 is greater than the thickness T3. In some embodiments, the thickness T3 is less than about 1.5 nm.

Referring to FIG. 15C, the gate dielectric layers 1530 include portions 1532 formed on the interfacial layers 1102, portions 1534 formed on sidewalls of the inner spacers 702, and portions 1536 formed on sidewalls of the gate spacers 402, in accordance with some embodiments. In the embodiments where the interfacial layers 1102 are omitted, the portions 1532 are formed on the semiconductor layers 108. In some embodiments, the portions 1206 and portions 1208 of the gate dielectric material layers 1202 are partially removed. The remaining portions of the portions 1206 turn into portions 1534 of the gate dielectric layers 1530, and the remaining portions of the portions 1208 turn into portions 1536 of the gate dielectric layers 1530.

The portions 1532 have the thickness T1 measured in the Z-direction, the portions 1534 have the thickness T2 measured in the X-direction, and the portions 1536 have the thickness T3 measured in the X-direction. In some embodiments, the thickness T1 is greater than the thickness T2 and thickness T3. In some embodiments, the thickness T2 is different from the thickness T3. That is, the thickness of the portions 1534 of the gate dielectric layers 1530 formed on the inner spacers 702 is different form the thickness of the portions 1536 of the gate dielectric layers 1530 formed on the gate spacers 402. In other embodiments, the thickness T2 and thickness T3 are substantially the same.

The thickness T2 may be in a range from 0 (see FIG. 15B, in which the gate dielectric layers do not include the portions formed on the inner spacers 702, and thus the thickness T2 is zero) to about 1.5 nm. In some embodiments, the difference between the first thickness T1 and thickness T2 is in a range from about 0.5 nm to about 3 nm, such as about 1 nm to about 3 nm. The thickness T3 may be in a range from 0 (see FIG. 15A, in which the gate dielectric layers do not include the portions formed on the gate spacers 402, and thus the thickness T3 is zero) to about 1.5 nm. In some embodiments, the difference between the first thickness T1 and thickness T3 is in a range from about 0.5 nm to about 3 nm, such as about 1 nm to about 3 nm.

Compared with a structure that has a gate dielectric with uniform thickness (i.e., the thickness of gate dielectric layer on channel layer/interfacial layer is the same as that on inner spacers and gate spacers), the embodiments described in the present disclosure can provide more space between the spacers (e.g., inner spacers and/or gate spacers). Specifically, by slimming the gate dielectric material layers, the portions of gate dielectric layers formed on spacers are thinner than that formed on channel layers/interfacial layers. As described above, the thickness T2/T3 is smaller than thickness T1 in accordance with some embodiments. In some embodiments, the difference between the thickness T1 and thickness T2/T3 is in a range from about 0.5 nm to about 3 nm. Therefore, in some embodiments, a distance in a range from about 1 nm to 6 nm can be enlarged between the inner spacers 702. In some embodiments, a distance in a range from about 1 nm to 6 nm can be enlarged between the gate spacers 402. These enlarged distances can be filled with gate electrode layers to increase the gate length.

FIGS. 16A to 16E show partial enlarged cross-sectional views of various embodiments of the present disclosure. The structures shown in FIGS. 16A to 16E may be similar to the semiconductor structure 100 shown in FIG. 14A described previously, except the gate dielectric layers shown in FIGS. 16A to 16E are varied with the gate dielectric layers 1302 shown in FIG. 14A in accordance with some embodiments. Processes and materials for forming the semiconductor structures shown in FIGS. 16A to 16E may be similar to, or the same as, those for forming the semiconductor structure 100 described previously and are not repeated herein. For example, the enlarged cross-sectional view shown in FIGS. 16A to 16E may be similar to the block 1420 in the FIG. 14A, and other elements in the semiconductor structure 100 not shown in FIGS. 16A to 16E may be similar to, or the same as, those shown in FIGS. 14A and 14B described previously in accordance with some embodiments.

Figures 16A, 16B, 16C:
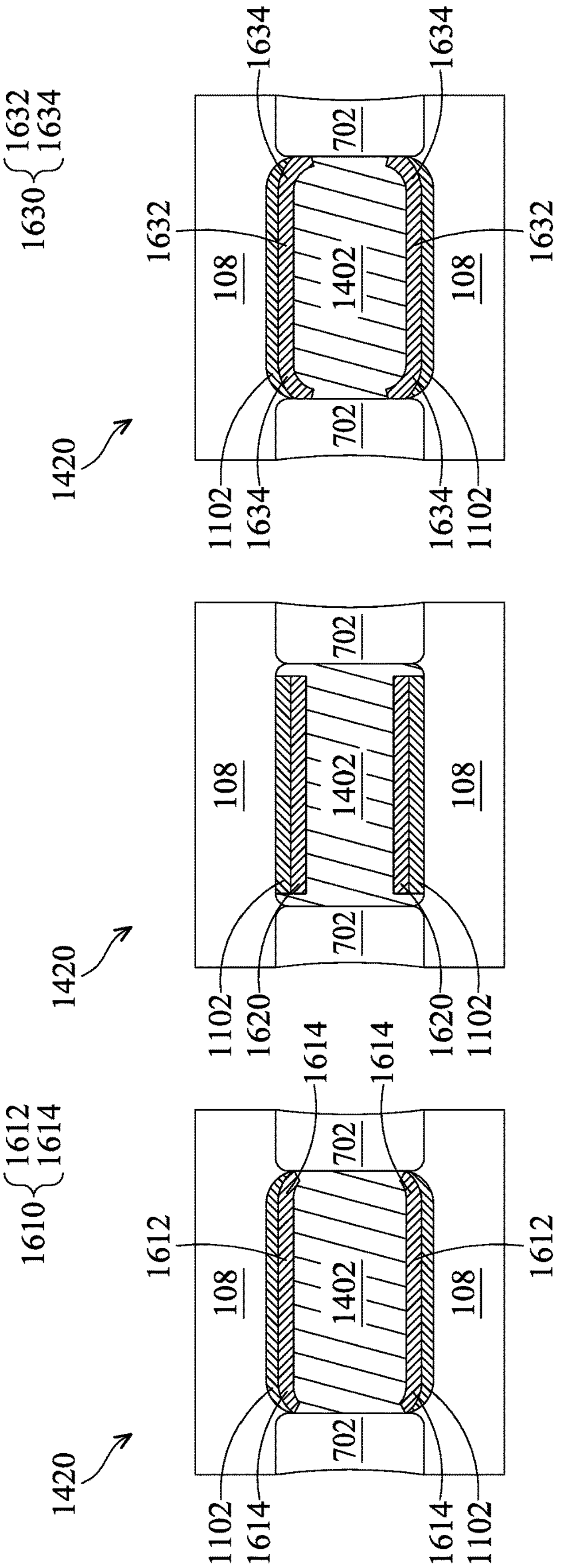
FIGS. 16A to 16E are partial enlarged cross-sectional views of some alternative embodiments of the workpiece of FIG. 14A.

Referring to FIG. 16A, the gate dielectric layers 1610 are formed on the interfacial layers 1102, in accordance with some embodiments. In the embodiments where the interfacial layers 1102 are omitted, the gate dielectric layers 1610 are formed on the semiconductor layers 108. In some embodiments, the gate dielectric layers 1610 include portions 1612 in the middle and portions 1614 in the edge. The portions 1614 extend and protrude from the portions 1612 and in contact with the inner spacers 702. In these embodiment, the gate electrode layers 1402 is in direct contact with the sidewalls of the inner spacers 702. In some embodiments, the thickness of the portions 1612 is greater than the thickness of the portions 1614.

Referring to FIG. 16B, the gate dielectric layers 1620 are formed on the interfacial layers 1102, in accordance with some embodiments. In the embodiments where the interfacial layers 1102 are omitted, the gate dielectric layers 1620 are formed on the semiconductor layers 108. In some embodiments, the gate dielectric layers 1620 are substantially horizontal. In some embodiments, the gate dielectric layers 1620 have no protruding portions that in contact with the inner spacers 702.

Referring to FIG. 16C, the gate dielectric layers 1630 are formed on the interfacial layers 1102, in accordance with some embodiments. In the embodiments where the interfacial layers 1102 are omitted, the gate dielectric layers 1630 are formed on the semiconductor layers 108. In some embodiments, the gate dielectric layers 1630 include portions 1632 in the middle and portions 1634 in the edge. The portions 1634 extend and protrude from the portions 1632 and partially cover sidewalls of the inner spacers 702, so that parts of the sidewalls of the inner spacers 702 are in direct contact with the gate electrode layers 1402. In some embodiments, the thickness of the portions 1632 is greater than the thickness of the portions 1634.

Figure 16E:
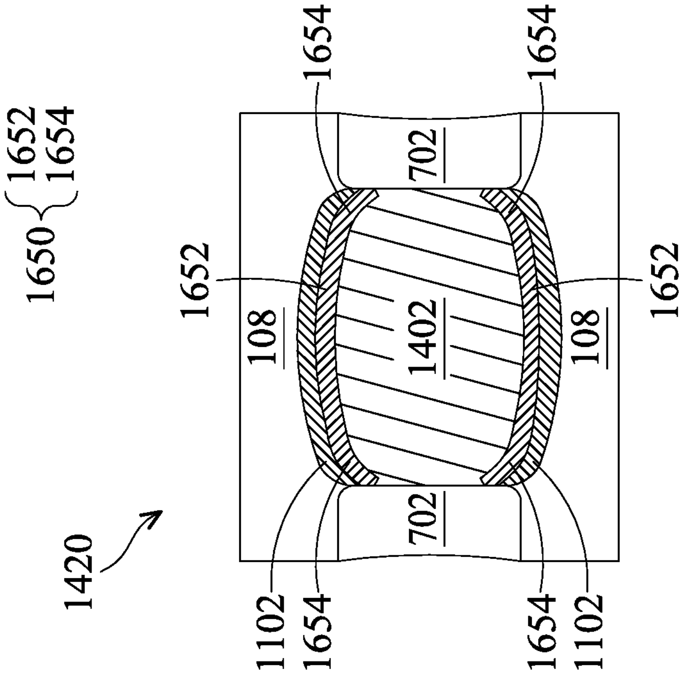
Figure 16D:
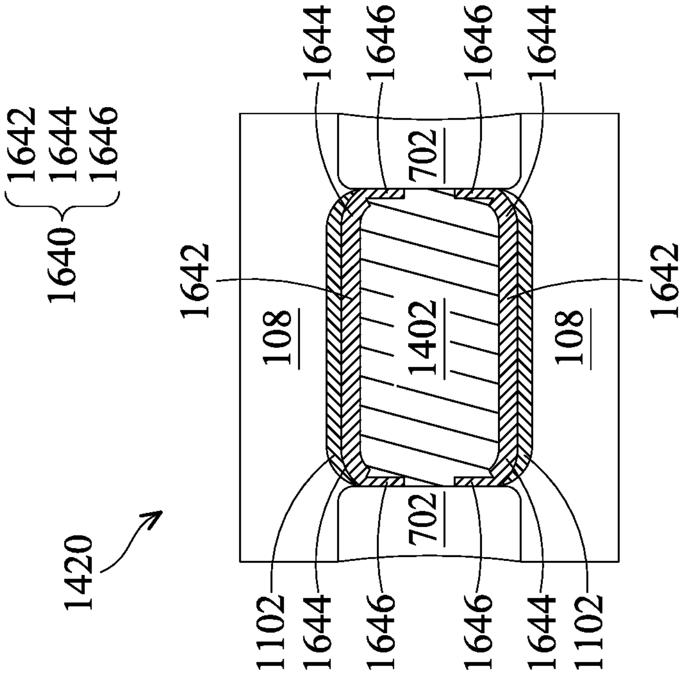

Referring to FIG. 16D, the gate dielectric layers 1640 include portions 1642 and portions 1644 formed on the interfacial layers 1102, in accordance with some embodiments. The portions 1644 extend and protrude from the portions 1642. In some embodiments, the gate dielectric layers 1640 further include portions 1646 extending and protruding from the portions 1644. The portions 1646 are formed on and partially cover sidewalls of the inner spacers 702, such that parts of the sidewalls of the inner spacers 702 are in direct contact with the gate electrode layers 1402. In some embodiments, the portions 1206 of the gate dielectric material layers 1202 are partially removed, and the remaining portions of the portions 1206 turn into portions 1646 of the gate dielectric layers 1640. Therefore, the thickness of the portions 1646 is thinner than the thickness of the portions 1642 and 1644. In some embodiments, the thickness of the portions 1642 is greater than the thickness of the portions 1644.

Referring to FIG. 16E, the gate dielectric layers 1650 are formed on the interfacial layers 1102, in accordance with some embodiments. In the embodiments where the interfacial layers 1102 are omitted, the gate dielectric layers 1650 are formed on the semiconductor layers 108. In some embodiments, the gate dielectric layers 1650 include portions 1652 in the middle and portions 1654 in the edge. The portions 1654 extend and protrude from the portions 1652 and in contact with the inner spacers 702. In some embodiments, the portions 1652 and portions 1654 are arc-shaped. In some embodiments, the radius of curvature of the portions 1652 is different from the radius of curvature of the portions 1654. In some embodiments, the radius of curvature of the portions 1652 is greater than the radius of curvature of the portions 1654. In some embodiments, the thickness of the portions 1652 is greater than the thickness of the portions 1654. FIGS. 16A to 16E have shown some embodiments illustrating relationships between gate dielectric layer and inner spacers 702, and these embodiments may also be applied to gate spacers 402.

FIGS. 17A to 17D show partial enlarged cross-sectional views of block 1420 in the FIG. 14A to illustrate various embodiments of the present disclosure. The structures shown in FIGS. 17A to 17D may be similar to the semiconductor structure 100 shown in FIG. 14A described previously, except the gate dielectric layers and the shape of the semiconductor layers shown in FIGS. 17A to 17D are varied with the gate dielectric layers 1302 and the shape of the semiconductor layers 108 shown in FIG. 14A in accordance with some embodiments. Processes and materials for forming the semiconductor structures shown in FIGS. 17A to 17D may be similar to, or the same as, those for forming the semiconductor structure 100 described previously and are not repeated herein. For example, the enlarged cross-sectional view shown in FIGS. 17A to 17D may be similar to the block 1420 in the FIG. 14A, and other elements in the semiconductor structure 100 not shown in FIGS. 17A to 17D may be similar to, or the same as, those shown in FIGS. 14A and 14B described previously in accordance with some embodiments. For the purpose of simplicity and clarity, the interfacial layers 1102 are omitted in FIGS. 17A to 17D, but it is noted that, the interfacial layers 1102 may be optionally formed between channel (e.g., semiconductor layers 108) and gate dielectric layers.

In FIGS. 17A to 17D, each of the semiconductor layers 108 includes a portion 1082 in the middle and a portion 1084 and a portion 1086 in the opposite terminals, in accordance with some embodiments. The portion 1084 and the portion 1086 can be referred to terminal portions due to their location. The portion 1082 extends between the portion 1084 and the portion 1086. The portion 1084 is connected to one source/drain feature 802 and the portion 1086 is connected to another source/drain feature 802. In some embodiments, the thicknesses of the portion 1084 and the portion 1086 are greater than the thickness of the portion 1082, such that the semiconductor layers 108 are formed as a dog-bone shape (or called dumbbell shape, barbell shape). The inner spacers 702 are disposed between the portion 1084 of one of the semiconductor layers 108 and the portion 1084 of another one of the semiconductor layers 108, and between the portion 1086 of the one of the semiconductor layers 108 and the portion 1086 of the another one of the semiconductor layers 108.

Figure 17B:
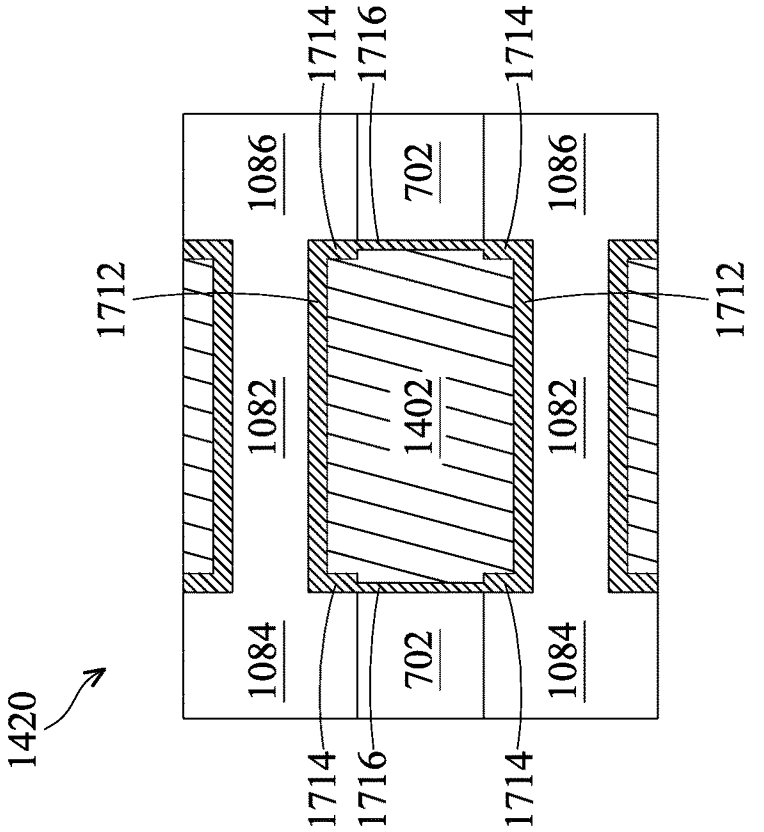
FIGS. 17A to 17D are partial enlarged cross-sectional views of some alternative embodiments of the workpiece of FIG. 14A.
Figure 17A:
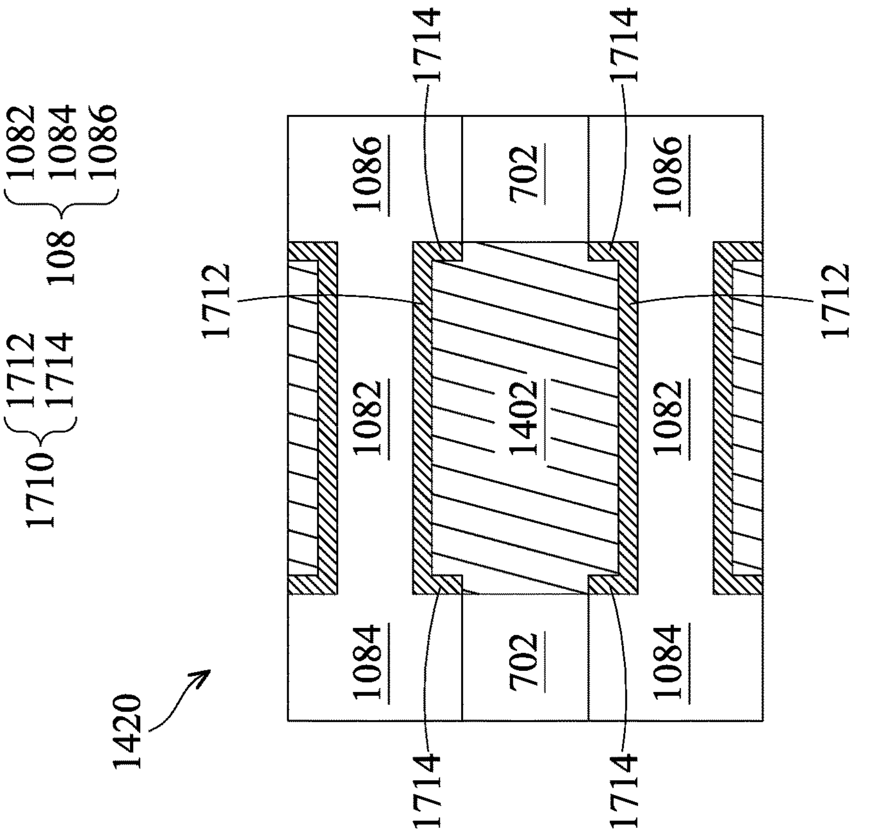

Referring to FIG. 17A, the gate dielectric layers 1710 include portions 1712 in the middle and portions 1714 in the edge, in accordance with some embodiments. In some embodiments, the portions 1714 extend and protrude from the portions 1712 and in contact with the inner spacers 702. The portions 1712 are formed and extend on the bottom surface or the top surface of the portions 1082 of the semiconductor layers 108. The portions 1714 are formed and extend on sidewalls of the portions 1084 and 1086 of the semiconductor layers 108. In other embodiments, the portions 1714 further extend and partially cover the sidewalls of the inner spacers 702. In certain embodiments, the thickness of the portions 1712 is greater than the thickness of the portions 1714.

Referring to FIG. 17B, the structure shown in FIG. 17B is similar to the structure shown in FIG. 17A, the difference is that the gate dielectric layers 1710 further include portions 1716 in FIG. 17B, in accordance with some embodiments. The portions 1716 extend from the portions 1714, and are formed on and cover sidewalls of the inner spacers 702. In some embodiments, the portions 1716 are formed by slimming the portions 1206 of the gate dielectric material layers 1202, and thus the portions 1716 are thinner than portions 1712 and 1714.

Figure 17D:
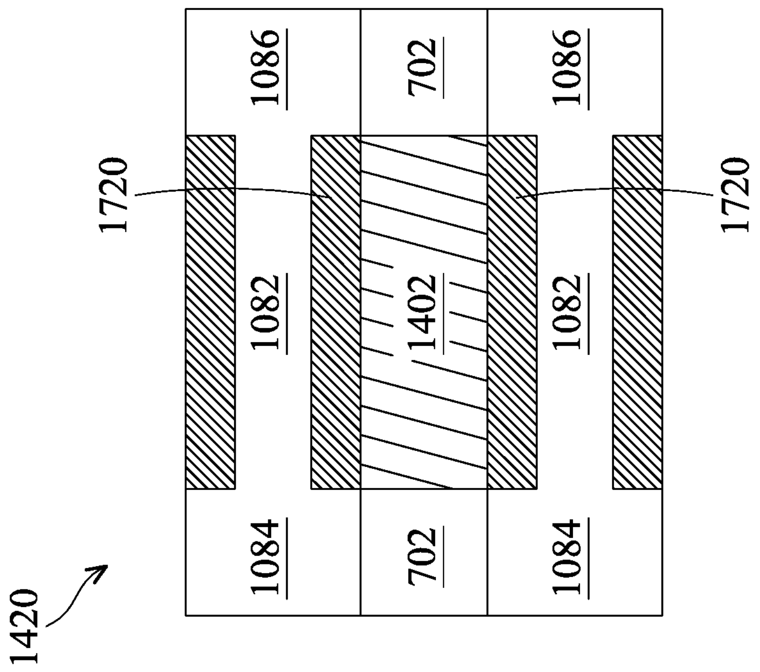
Figure 17C:
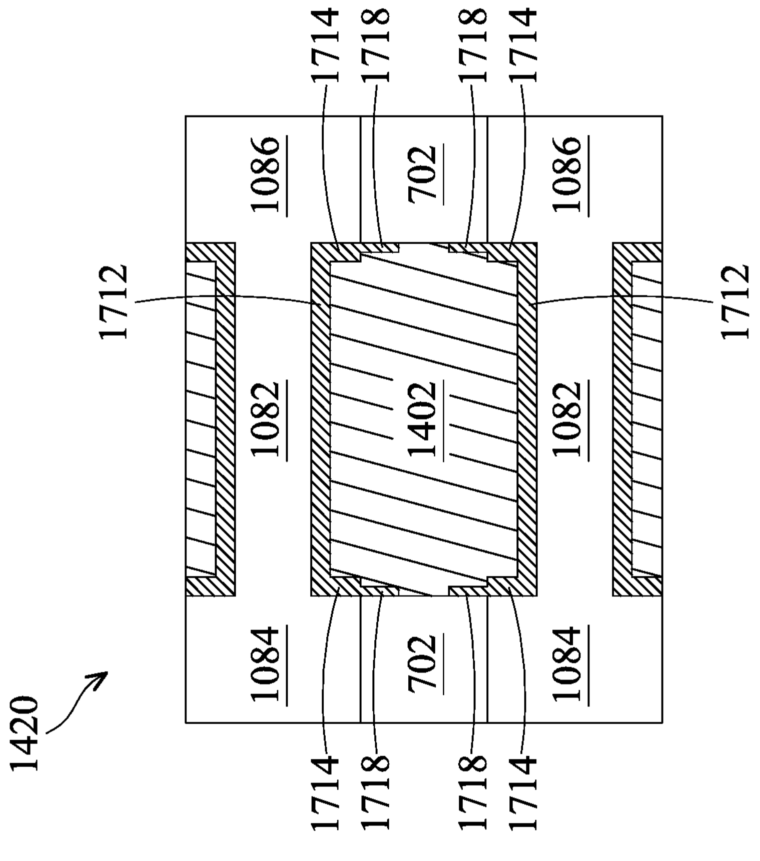

Referring to FIG. 17C, the structure shown in FIG. 17C is similar to the structure shown in FIG. 17A, except the gate dielectric layers 1710 further include portions 1718 in FIG. 17C, in accordance with some embodiments. The portions 1718 extend from the portions 1714, and are formed on and partially cover sidewalls of the inner spacers 702, such that parts of the sidewalls of the inner spacers 702 are in direct contact with the gate electrode layers 1402. In some embodiments, the portions 1718 are formed by slimming the portions 1206 of the gate dielectric material layers 1202, and thus the portions 1718 are thinner than portions 1712 and 1714.

Referring to FIG. 17D, the gate dielectric layers 1720 are formed on the bottom surface or the top surface of the portions 1082 and the sidewalls of the portions 1084 and 1086, in accordance with some embodiments. The gate dielectric layers 1720 completely fill the spaces constituted between the portions 1082, 1084, and 1086. In some embodiments, the gate dielectric layers 1720 further include thinner portions completely or partially covering sidewalls of the inner spacers 702. The thinner portions are formed by slimming the portions 1206 of the gate dielectric material layers 1202, and thus the thinner portions are thinner than other portions of the gate dielectric layers 1720. FIGS. 17A to 17D have shown some embodiments illustrating relationships between gate dielectric layers and inner spacers 702, and these embodiments may also be applied to gate spacers 402.

Figure 18A:
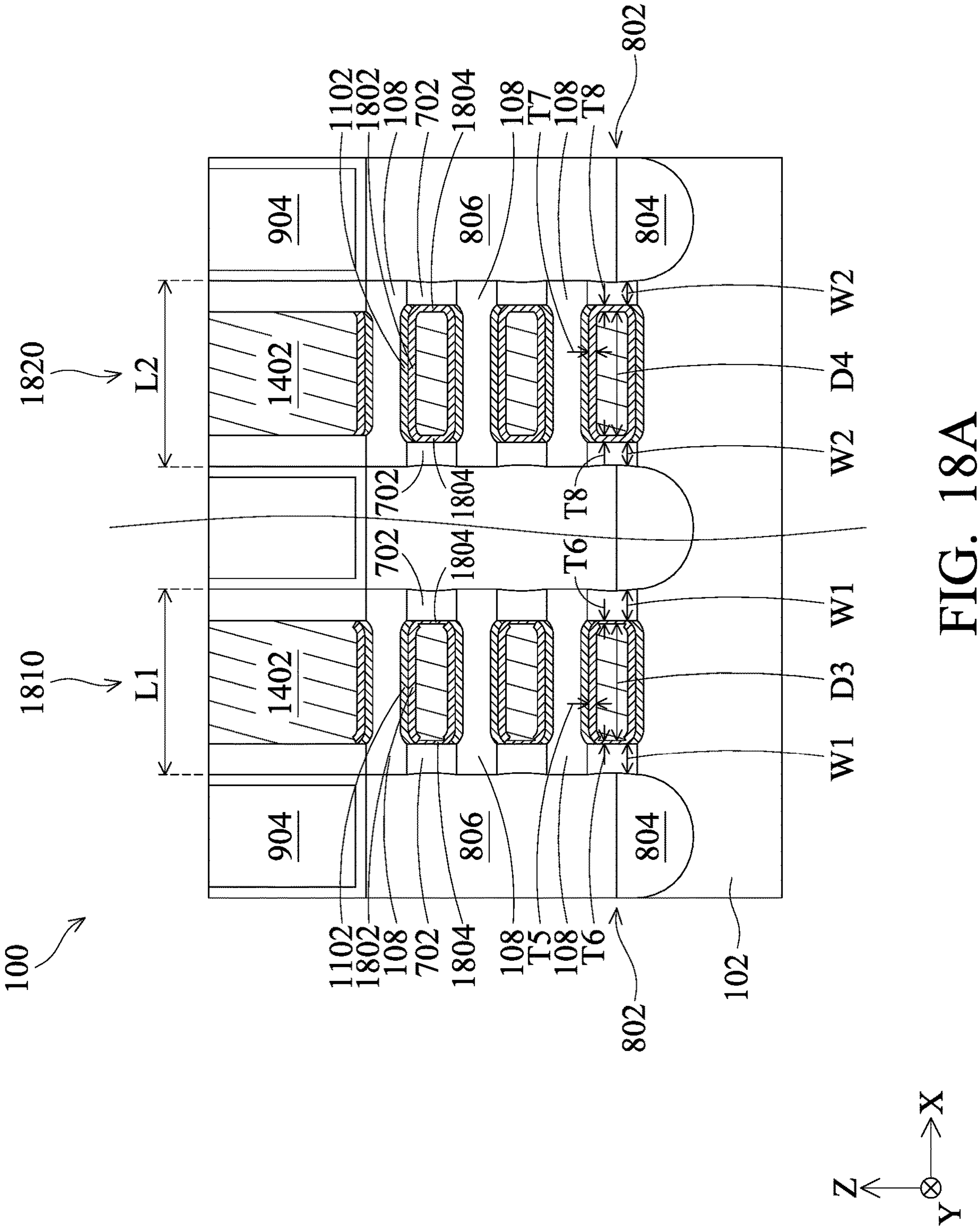
FIGS. 18A to 18C are cross-sectional views of some alternative embodiments of the workpiece of FIG. 14A.
Figure 18B:
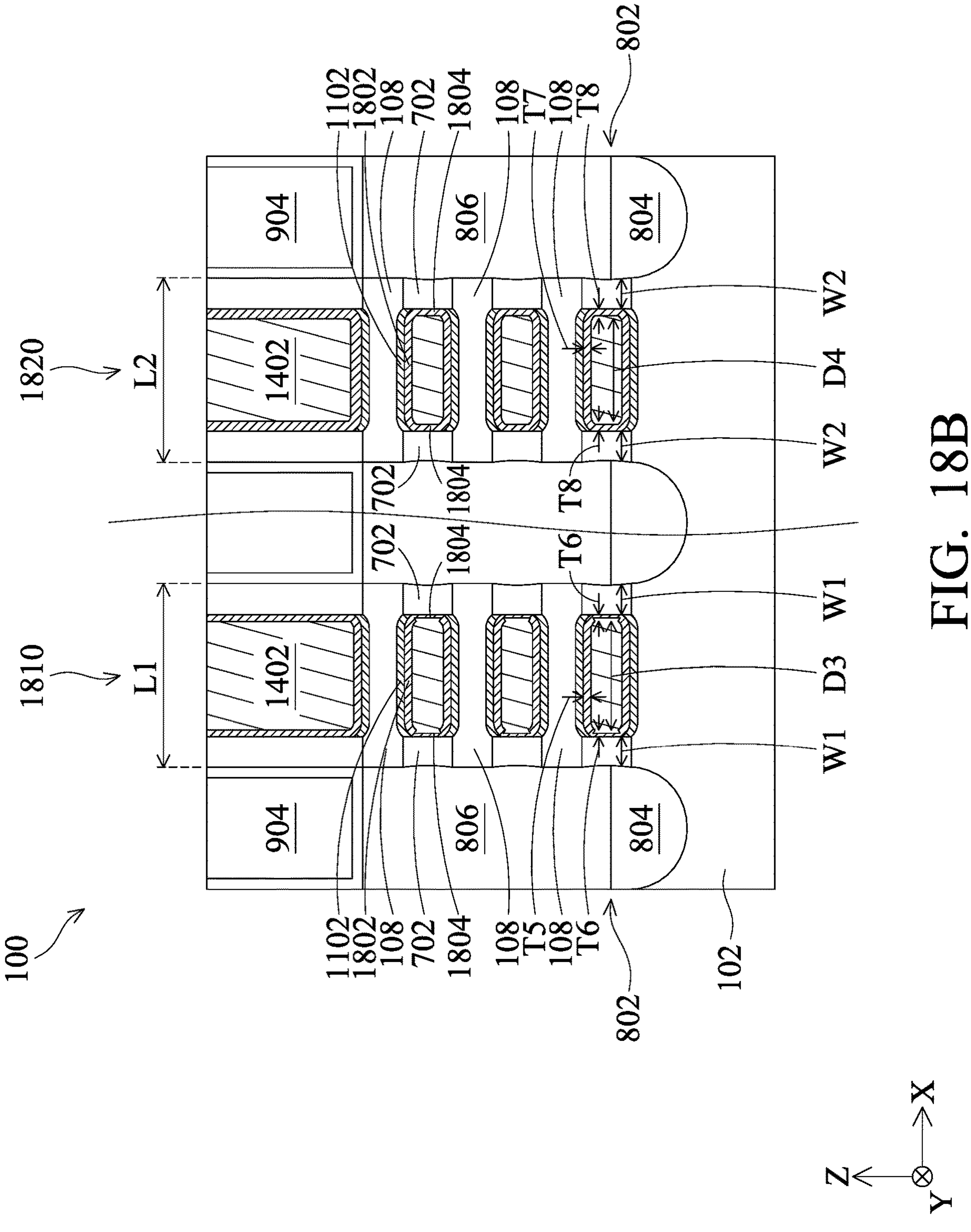
Figure 18C:
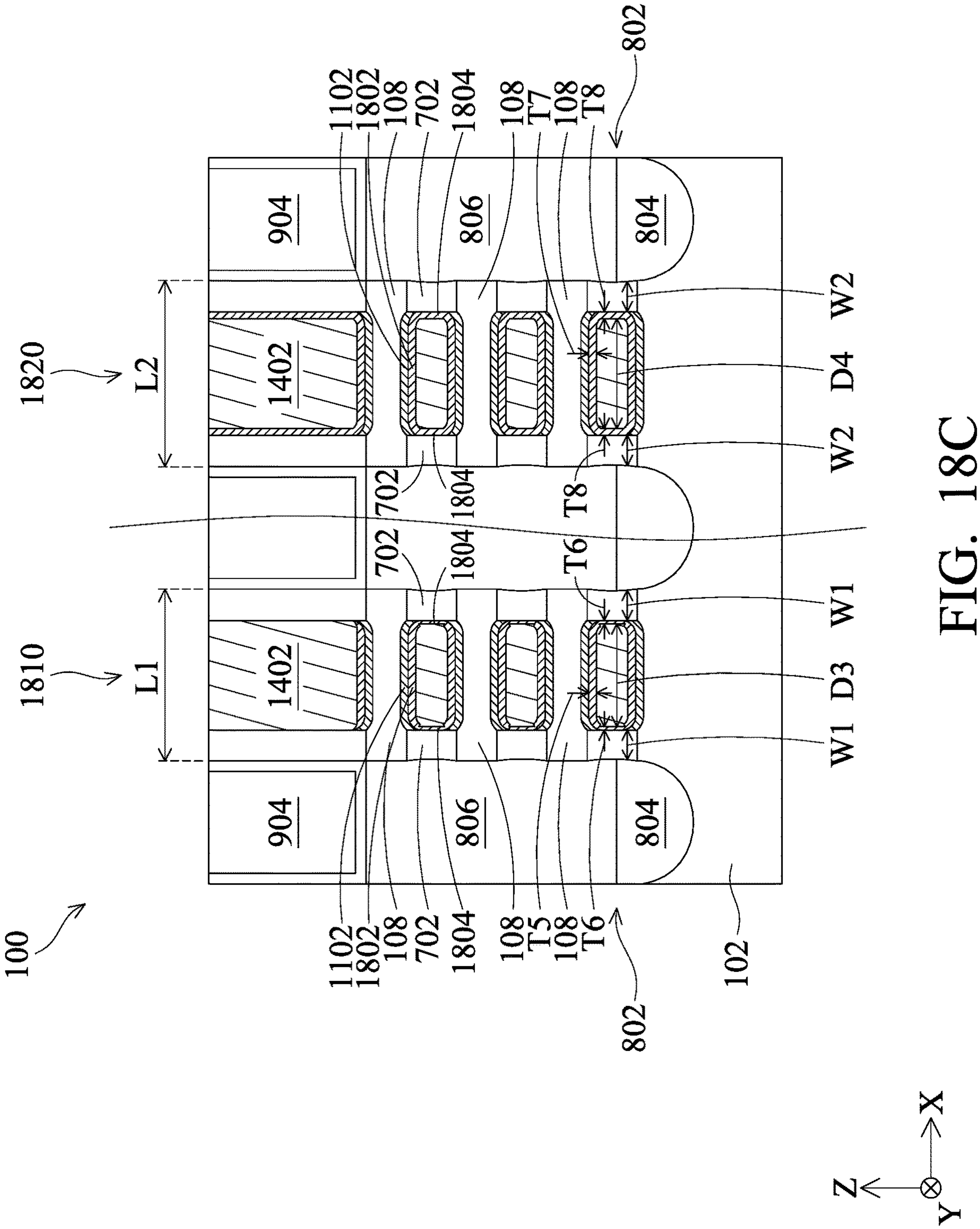

FIGS. 18A to 18C are cross-sectional views of some alternative embodiments of the workpiece 100 of FIG. 14A. For the purpose of simplicity and clarity, some elements are not shown in FIGS. 18A to 18C. In FIGS. 18A to 18C, the semiconductor structure 100 includes a structure 1810 and a structure 1820. Each of the structure 1810 and the structure 1820 includes a vertical stack including the semiconductor layers 108 suspended over the substrate 102. Each of the structure 1810 and the structure 1820 includes the gate structure 1404 wrapping around each of the semiconductor layers 108. Each of the structure 1810 and the structure 1820 includes the inner spacers 702 formed on opposite sides of the gate structure 1404 and between the semiconductor layers 108, and connected to the source/drain features 802. In the structure 1810 and the structure 1820, the gate dielectric layers 1302 include portions 1802 formed on interfacial layers 1102 or semiconductor layers 108 and portions 1804 formed on sidewalls of the inner spacers 702.

In some embodiments, in the structure 1810, the inner spacers 702 have a width W1, the portions 1802 have a thickness T5, and the portions 1804 have a thickness T6. There is a distance D3 extending in X-direction between a pair of the portions 1804 formed on a pair of the inner spacers 702. The distance D3 corresponds to the gate length of the structure 1810. The channel region of the structure 1810 has a length L1 that is equal to the sum of twice the width W1, twice the thickness T6, and the distance D3. In some embodiments, in the structure 1820, the inner spacers 702 have a width W2, the portions 1802 have a thickness T7, and the portions 1804 have a thickness T8. There is a distance D4 extending in X-direction between a pair of the portions 1804 formed on a pair of the inner spacers 702. The distance D4 corresponds to the gate length of the structure 1820. The channel region of the structure 1820 has a length L2 that is equal to the sum of twice the width W2, twice the thickness T8, and the distance D4. The widths W1 and W2 and the thicknesses T6 and T8 are measured in the X-direction, and the thicknesses T5 and T7 are measured in the Z-direction.

In the structure 1810, the thickness T6 of the portions 1804 is smaller than the thickness T5 of the portions 1802. In the structure 1820, the thickness T8 of the portions 1804 is smaller than or equal to the thickness T7 of the portions 1802. In some embodiments, the thickness T5 is substantially the same as the thickness T7. That is, in both structures 1810 and the 1820, the thicknesses of the portions 1802 of the gate dielectric layers 1302 formed on interfacial layers 1102 or semiconductor layers 108 are substantially the same. In the embodiment where the gate dielectric material layers are completely removed from the inner spacers 702 of the structure 1810, the thickness T6 is zero.

Referring to FIG. 18A, the width W1 is greater than the width W2, the thickness T6 is smaller than the thickness T8, the distance D3 is substantially equal to the distance D4, and the length L1 is substantially equal to the length L2, in accordance with some embodiments. That is, in cases where the dimensions of the channel regions are the same (i.e., L1=L2), the structure 1810 has greater dimensions of the inner spacers than the structure 1820 (i.e., W1>W2), and the dimensions of gate lengths can be kept the same (i.e., D3=D4). Since the portions 1804 of the structure 1810 are formed by slimming the gate dielectric material layers, the space between the portions 1804 (or between the inner spacers 702, in the embodiment where the thickness T6 is zero) can be enlarged. The enlarged space can be utilized to increase the width of the inner spacers (i.e., width W1). Since the high-k material of the gate dielectric layers is replaced by the low-k material of the inner spacers with increased width, the parasitic capacitance can be suppressed. At the same time, the same dimensions can be retained for the gate length and the entire structure.

Referring to FIG. 18B, the width W1 is substantially the same as the width W2, the thickness T6 is smaller than the thickness T8, the distance D3 is greater than the distance D4, and the length L1 is substantially equal to the length L2, in accordance with some embodiments. That is, in cases where the dimensions of the channel regions and the inner spacers are the same (i.e., L1=L2, W1=W2), the structure 1810 has greater dimensions of the gate length than the structure 1820 (i.e., D3>D4). Since the portions 1804 of the structure 1810 are formed by slimming the gate dielectric material layers, the space between the portions 1804 (or between the inner spacers 702, in the embodiment where the thickness T6 is zero) can be enlarged. The enlarged space can be utilized to increase the gate length (i.e., distance D3). Since the gate length is increased, the SCE can be suppressed. At the same time, the same dimensions can be maintained for the inner spacers and the entire structure.

Referring to FIG. 18C, the width W1 is substantially the same as the width W2, the thickness T6 is smaller than the thickness T8, the distance D3 is equal to the distance D4, and the length L1 is smaller than the length L2. That is, in cases where the dimensions of the gate lengths and inner spacers are the same (i.e., D3=D4, W1=W2), the structure 1810 has smaller dimensions of the entire structure than the structure 1820 (i.e., L1<L2). Since the portions 1804 of the structure 1810 are formed by slimming the gate dielectric material layers, the space between the portions 1804 (or between the inner spacers 702, in the embodiment where the thickness T6 is zero) can be enlarged. The enlarged space can be utilized to scale down the channel region (i.e., length L1). Since the channel region is scaled down, the dimensions of the entire structure can also be scale down. At the same time, the same dimensions are retained for the gate lengths and the inner spacers. In other embodiments, the space saved by scaling down the channel region may be distributed to enlarge the source/drain region, thereby the difficulty of performing epitaxy processes in the source/drain regions can be reduced. FIGS. 18A to 18C have shown embodiments illustrating relationships between gate dielectric layers and inner spacers 702, and these embodiments may also be applied to gate spacers 402.

Embodiments of the present disclosure offer advantages over the existing art, though it is understood that other embodiments may offer different advantages, not all advantages are necessarily discussed herein, and no particular advantage is required for all embodiments. The embodiments disclosed herein relate to semiconductor structures and their forming methods, and more particularly to methods and semiconductor structures including slimmed spacers that include inner spacers and/or gate spacers. The slimmed spacers can enlarge the space between the spacers. The enlarged space can be utilized to increase gate length to suppress short channel effect, or utilized to increase the width of inner spacers to suppress the parasitic capacitance. Furthermore, the enlarged space can be utilized to scale down the dimensions of the entire structure, while the dimension of gate length stays the same.

Thus, one of the embodiments of the present disclosure describes a semiconductor structure. The semiconductor structure includes a substrate, a vertical stack including nanostructures, and a gate structure wrapping around each of the nanostructures. The nanostructures are suspended over and vertically arranged over the substrate. The gate structure includes a gate dielectric layer and a gate electrode formed on the gate dielectric layer. The semiconductor structure further includes inner spacers and gate spacers. The inner spacers are formed on opposite sides of the gate structure, between the nanostructures, and separating the nanostructures from each other. The gate spacers are formed on the opposite sides of the gate structure and over a topmost one of the nanostructures. The gate dielectric layer includes a first portion formed on the nanostructures and a second portion extending from the first portion. The first portion and the second portion have a first thickness and a second thickness, respectively. The first thickness is greater than the second thickness.

In some embodiments, a difference between the first thickness and the second thickness is in a range from about 1 nm to about 3 nm. In some embodiments, the second portion protrudes from the first portion and is in contact with the inner spacers.

In some embodiments, the second portion partially covers sidewalls of the inner spacers, such that parts of the sidewalls of the inner spacers are in direct contact with the gate electrode.

In some embodiments, in a cross-sectional view, the first portion and the second portion are arc-shaped, and a radius of curvature of the first portion is different from a radius of curvature of the second portion.

In some embodiments, the second portion is formed on sidewalls of the inner spacers. In some embodiments, the gate dielectric layer further includes a third portion formed on sidewalls of the gate spacer, and wherein the third portion has a third thickness smaller than the first thickness and different from the second thickness.

In some embodiments, the semiconductor structure further includes a first source/drain feature and a second source/drain feature, attached to opposite sides of the nanostructures. Each of the nanostructures includes a first terminal portion connecting to the first source/drain feature, a second terminal portion connecting to the second source/drain feature, and a middle portion extending between the first terminal portion and the second terminal portion. Thicknesses of the first terminal portion and the second terminal portion are greater than a thickness of the middle portion. The inner spacers are disposed between the first terminal portion of one of the nanostructures and the first terminal portion of another one of the nanostructures and between the second terminal portion of the one of the nanostructures and the second terminal portion of the another one of the nanostructures.

In some embodiments, in a cross-sectional view, the first portion extends on a bottom surface or a top surface of the middle portion, and the second portion extends on sidewalls of the first terminal portion and the second terminal portion.

In some embodiments, the second portion is formed on sidewalls of the inner spacers. In some embodiments, the second portion of the gate dielectric layer partially covers sidewalls of the inner spacers, such that parts of the sidewalls of the inner spacers are in direct contact with the gate electrode.

In some embodiments, in a cross-sectional view, a space is constituted between the first terminal portion, the second terminal portion and the middle portion, and wherein the space is completely filled with the first portion of the gate dielectric layer.

In another of the embodiments, discussed is a semiconductor structure that includes a substrate, a first vertical stack including first nanostructures, a first source/drain feature and a second source/drain feature, and a first gate structure, wrapping around each of the first nanostructures. The first nanostructures are suspended over the substrate. The first source/drain feature and the second source/drain feature are attached to opposite sides of the first nanostructures. The first gate structure includes a first gate dielectric layer and a first gate electrode formed on the first gate dielectric layer. The semiconductor structure further includes first inner spacers and second inner spacers, formed on opposite sides of the first gate structure and between the first nanostructures. The first inner spacers and the second inner spacers are connected to the first source/drain feature and the second source/drain feature, respectively. The first gate dielectric layer includes a first portion formed on the first nanostructures, a second portion formed on sidewalls of the first inner spacers, and a third portion formed on sidewalls of the second inner spacers. A second thickness of the second portion and a third thickness of the third portion are smaller than a first thickness of the first portion.

In some embodiments, the semiconductor structure further includes a second vertical stack including second nanostructures, a third source/drain feature and a fourth source/drain feature, and a second gate structure wrapping around each of the second nanostructures. The second nanostructures are suspended over the substrate. The third source/drain feature and the fourth source/drain feature are attached to opposite sides of the second nanostructures. The second gate structure includes a second gate dielectric layer and a second gate electrode formed on the second gate dielectric layer. The semiconductor structure further includes third inner spacers and fourth inner spacers, formed on opposite sides of the second gate structure and between the second nanostructures. The third inner spacers and the fourth inner spacers are connected to the third source/drain feature and the fourth source/drain feature, respectively. The second gate dielectric layer includes a fourth portion disposed on the second nanostructures, a fifth portion formed on sidewalls of the third inner spacers, and a sixth portion formed on sidewalls of the fourth inner spacers. A fourth thickness of the fourth portion of the second gate dielectric layer is substantially the same as the first thickness of the first portion of the first gate dielectric layer.

In some embodiments, a first width of the first inner spacers and a second width of the second inner spacers are greater than a third width of the third inner spacers and a fourth width of the fourth inner spacers. The second thickness of the second portion and the third thickness of the third portion are smaller than a fifth thickness of the fifth portion and a sixth thickness of the sixth portion. A first distance between the second portion and the third portion is substantially equal to a second distance between the fifth portion and the sixth portion.

In some embodiments, a sum of the first width, the second width, the first distance, the second thickness, and the third thickness is substantially equal to a sum of the third width, the fourth width, the second distance, the fifth thickness, and the sixth thickness.

In some embodiments, a first width of the first inner spacers, a second width of the second inner spacers, a third width of the third inner spacers, and a fourth width of the fourth inner spacers are substantially the same as each other. The second thickness of the second portion and the third thickness of the third portion are smaller than a fifth thickness of the fifth portion and a sixth thickness of the sixth portion. A first distance between the second portion and the third portion is greater than a second distance between the fifth portion and the sixth portion.

In some embodiments, a sum of the second thickness, the third thickness, and the first distance is substantially equal to a sum of the fifth thickness, the sixth thickness, and the second distance.

In some embodiments, a first width of the first inner spacers, a second width of the second inner spacers, a third width of the third inner spacers, and a fourth width of the fourth inner spacers are substantially the same as each other. The second thickness of the second portion and the third thickness of the third portion are smaller than a fifth thickness of the fifth portion and a sixth thickness of the sixth portion. A first distance between the second portion and the third portion is equal to a second distance between the fifth portion and the sixth portion.

In some embodiments, a sum of the first width, the second width, the first distance, the second thickness, and the third thickness is smaller than a sum of the third with, the fourth width, the second distance, the fifth thickness, and the sixth thickness.

In some embodiments, the semiconductor structure further includes first gate spacers, formed on the opposite sides of the first gate structure and over a topmost one of the first nanostructures. The first gate dielectric layer further includes a seventh portion formed on sidewalls of the first gate spacers, and wherein the seventh portion has a seventh thickness smaller than the first thickness of the first portion.

In yet another of the embodiments, discussed is a method of forming a semiconductor structure including forming a fin structure, forming a dummy gate structure over the fin structure, and forming a first source/drain trench and a second source/drain trench in the fin structure on opposite sides of the dummy gate structure. The fin structure includes first semiconductor layers and second semiconductor layers alternately stacked over a substrate. The method further includes partially recessing the first semiconductor layers exposed in the first source/drain trench and the second source/drain trench to form inner spacer recesses, forming inner spacers in the inner spacer recesses, removing the dummy gate structure and the first semiconductor layers to form a gate trench, and forming a gate dielectric layer wrapping around each of the second semiconductor layers. The gate dielectric layer includes a first portion covering the nanostructures and a second portion extending from the first portion. The first portion and the second portion have a first thickness and a second thickness, respectively, and the first thickness is greater than the second thickness.

In some embodiments, the second portion protrudes from the first portion and is in contact with the inner spacers.

In some embodiments, the method further includes forming a gate electrode on the gate dielectric layer, wherein the gate electrode is in direct contact with sidewalls of the inner spacers.

In some embodiments, the method further includes forming gate spacers on sidewalls of the dummy gate structure. The gate dielectric layer further includes a third portion formed on sidewalls of the gate spacers. The third portion has a third thickness smaller than the first thickness of the first portion.

In some embodiments, the second portion is formed on sidewalls of the inner spacers, and the second thickness of the second portion is different from the third thickness of the third portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a substrate;

a vertical stack comprising nanostructures, wherein the nanostructures are suspended over and vertically arranged over the substrate;

a gate structure, wrapping around each of the nanostructures, wherein the gate structure comprises a gate dielectric layer and a gate electrode formed on the gate dielectric layer;

inner spacers, formed on opposite sides of the gate structure, between the nanostructures, and separating the nanostructures from each other; and gate spacers, formed on the opposite sides of the gate structure and over a topmost one of the nanostructures, wherein the gate dielectric layer comprises a first portion formed on the nanostructures, a second portion extending from the first portion and formed on sidewalls of the inner spacers, and a third portion formed on sidewalls of the gate spacers, wherein the first portion and the second portion have a first thickness and a second thickness, respectively, wherein the first thickness is greater than the second thickness, and wherein the third portion has a third thickness smaller than the first thickness and different from the second thickness.

2. The semiconductor structure of claim 1, wherein a difference between the first thickness and the second thickness is in a range from about 1 nm to about 3 nm.

3. The semiconductor structure of claim 1, wherein the second portion protrudes from the first portion and is in contact with the inner spacers.

4. The semiconductor structure of claim 3, wherein the second portion partially covers sidewalls of the inner spacers, such that parts of the sidewalls of the inner spacers are in direct contact with the gate electrode.

5. The semiconductor structure of claim 3, wherein in a cross-sectional view, the first portion and the second portion are arc-shaped, and a radius of curvature of the first portion is different from a radius of curvature of the second portion.

6. A semiconductor structure, comprising:

a substrate;

a first vertical stack comprising first nanostructures, wherein the first nanostructures are suspended over the substrate;

a first source/drain feature and a second source/drain feature, attached to opposite sides of the first nanostructures;

a first gate structure, wrapping around each of the first nanostructures, wherein the first gate structure comprises a first gate dielectric layer and a first gate electrode formed on the first gate dielectric layer; and first inner spacers and second inner spacers, formed on opposite sides of the first gate structure and between the first nanostructures, wherein the first inner spacers and the second inner spacers are connected to the first source/drain feature and the second source/drain feature, respectively, wherein the first gate dielectric layer comprises a first portion formed on the first nanostructures, a second portion formed on sidewalls of the first inner spacers, and a third portion formed on sidewalls of the second inner spacers, and wherein a second thickness of the second portion and a third thickness of the third portion are smaller than a first thickness of the first portion.

7. The semiconductor structure of claim 6, further comprising:

a second vertical stack comprising second nanostructures, wherein the second nanostructures are suspended over the substrate;

a third source/drain feature and a fourth source/drain feature, attached to opposite sides of the second nanostructures;

a second gate structure, wrapping around each of the second nanostructures, wherein the second gate structure comprises a second gate dielectric layer and a second gate electrode formed on the second gate dielectric layer; and third inner spacers and fourth inner spacers, formed on opposite sides of the second gate structure and between the second nanostructures, wherein the third inner spacers and the fourth inner spacers are connected to the third source/drain feature and the fourth source/drain feature, respectively, wherein the second gate dielectric layer comprises a fourth portion disposed on the second nanostructures, a fifth portion formed on sidewalls of the third inner spacers, and a sixth portion formed on sidewalls of the fourth inner spacers, and wherein a fourth thickness of the fourth portion of the second gate dielectric layer is substantially the same as the first thickness of the first portion of the first gate dielectric layer.

8. The semiconductor structure of claim 7, wherein:

a first width of the first inner spacers and a second width of the second inner spacers are greater than a third width of the third inner spacers and a fourth width of the fourth inner spacers;

the second thickness of the second portion and the third thickness of the third portion are smaller than a fifth thickness of the fifth portion and a sixth thickness of the sixth portion; and a first distance between the second portion and the third portion is substantially equal to a second distance between the fifth portion and the sixth portion.

9. The semiconductor structure of claim 8, wherein a sum of the first width, the second width, the first distance, the second thickness, and the third thickness is substantially equal to a sum of the third width, the fourth width, the second distance, the fifth thickness, and the sixth thickness.

10. The semiconductor structure of claim 7, wherein:

a first width of the first inner spacers, a second width of the second inner spacers, a third width of the third inner spacers, and a fourth width of the fourth inner spacers are substantially the same as each other;

the second thickness of the second portion and the third thickness of the third portion are smaller than a fifth thickness of the fifth portion and a sixth thickness of the sixth portion; and a first distance between the second portion and the third portion is greater than a second distance between the fifth portion and the sixth portion.

11. The semiconductor structure of claim 10, wherein a sum of the second thickness, the third thickness, and the first distance is substantially equal to a sum of the fifth thickness, the sixth thickness, and the second distance.

12. The semiconductor structure of claim 7, wherein:

a first width of the first inner spacers, a second width of the second inner spacers, a third width of the third inner spacers, and a fourth width of the fourth inner spacers are substantially the same as each other;

the second thickness of the second portion and the third thickness of the third portion are smaller than a fifth thickness of the fifth portion and a sixth thickness of the sixth portion; and a first distance between the second portion and the third portion is equal to a second distance between the fifth portion and the sixth portion.

13. The semiconductor structure of claim 12, wherein a sum of the first width, the second width, the first distance, the second thickness, and the third thickness is smaller than a sum of the third with, the fourth width, the second distance, the fifth thickness, and the sixth thickness.

14. The semiconductor structure of claim 6, further comprising:

first gate spacers, formed on the opposite sides of the first gate structure and over a topmost one of the first nanostructures;

wherein the first gate dielectric layer further comprises a seventh portion formed on sidewalls of the first gate spacers, and wherein the seventh portion has a seventh thickness smaller than the first thickness of the first portion.

15. A semiconductor structure, comprising:

a plurality of nanostructures, arranged over a base portion in a vertical direction;

an isolation structure, disposed around the base portion;

a gate structure, comprising interfacial layers wrapped around each of the nanostructures, a gate dielectric layer over the interfacial layers, and a gate electrode layer over the gate dielectric layer, wherein the gate dielectric layer comprises horizontal portions formed on the interfacial layers and vertical portions extending from the horizontal portions;

source/drain features, disposed on opposite sides of the gate structure in a first direction and attached to the nanostructures, wherein the first direction is different from the vertical direction; and inner spacers, formed on the opposite sides of the gate structure in the first direction and between the nanostructures in the vertical direction, wherein the inner spacers space apart the nanostructures and the source/drain features, wherein a first thickness of the horizontal portions of the gate dielectric layer in the vertical direction is different from a second thickness of the vertical portions of the gate dielectric layer in the first direction, wherein each of the nanostructures comprises terminal portions connected to the source/drain features and a middle portion extending between the terminal portions, and wherein third thicknesses of the terminal portions are greater than a fourth thickness of the middle portion, wherein the inner spacers are disposed between the terminal portions in the vertical direction, and wherein in a cross-sectional view, the horizontal portions extend on bottom surfaces or top surfaces of the middle portions, and the vertical portions extend on sidewalls of the terminal portions.

16. The semiconductor structure of claim 15, wherein the vertical portions of the gate dielectric layer are formed on sidewalls of the inner spacers, and the second thickness of the vertical portions is smaller than the first thickness of the horizontal portions of the gate dielectric layer.

17. The semiconductor structure of claim 15, wherein the vertical portions of the gate dielectric layer partially cover sidewalls of the inner spacers, such that the sidewalls of the inner spacers are in direct contact with the gate electrode layer.

18. The semiconductor structure of claim 15, further comprising:

gate spacers, formed on the opposite sides of the gate structure and over a topmost one of the nanostructures, wherein the gate spacers are in direct contact with the gate electrode layer.

19. The semiconductor structure of claim 15, further comprising:

gate spacers, formed on the opposite sides of the gate structure and over a topmost one of the nanostructures, wherein the vertical portions are first vertical portions and the gate dielectric layer further comprises second vertical portions formed on sidewalls of the gate spacers, and wherein a fifth thickness of the second vertical portions in the first direction is smaller than the first thickness of the horizontal portions of the gate dielectric layer.

20. The semiconductor structure of claim 19, wherein the gate spacers are spaced apart from the gate electrode layer by the second vertical portions of the gate dielectric layer.

* * * * *